United States Patent
Lee

(10) Patent No.: US 10,879,452 B2
(45) Date of Patent: Dec. 29, 2020

(54) MAGNETIC TUNNEL JUNCTION DEVICE AND MAGNETIC MEMORY DEVICE

(71) Applicant: Korea University Research and Business Foundation, Seoul (KR)

(72) Inventor: Kyung-Jin Lee, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 16/859,567

(22) Filed: Apr. 27, 2020

(65) Prior Publication Data

US 2020/0259075 A1    Aug. 13, 2020

Related U.S. Application Data

(63) Continuation of application No. 15/474,221, filed on Mar. 30, 2017, now Pat. No. 10,693,058.

(30) Foreign Application Priority Data

Oct. 20, 2016 (KR) .......... 10-2016-0136757

(51) Int. Cl.
*H01L 43/04* (2006.01)
*H01L 43/08* (2006.01)
(Continued)

(52) U.S. Cl.
CPC ............ *H01L 43/04* (2013.01); *H01L 27/228* (2013.01); *H01L 43/02* (2013.01); *H01L 43/06* (2013.01); *H01L 43/08* (2013.01); *H01L 43/10* (2013.01)

(58) Field of Classification Search
CPC ..... H01L 27/22; H01L 27/222; H01L 27/224; H01L 27/228; H01L 27/24;
(Continued)

(56) References Cited

U.S. PATENT DOCUMENTS

| 7,595,966 B2 | 9/2009 | Watanabe et al. |
| 8,023,315 B2 | 9/2011 | Fukami |

(Continued)

FOREIGN PATENT DOCUMENTS

| JP | 2007-080952 A | 3/2007 |
| JP | 2013-115319 A | 6/2013 |

(Continued)

OTHER PUBLICATIONS

Amin, V. P., "Spin transport at interfaces with spin-orbit coupling: Formalism," Physical Review B, vol. 94, No. 10, 104419, pp. 1-16 (2016).

(Continued)

*Primary Examiner* — Cheung Lee
(74) *Attorney, Agent, or Firm* — Jenkins, Wilson, Taylor & Hunt P.A.

(57) ABSTRACT

A magnetic tunnel junction device and magnetic memory device. The magnetic tunnel junction device includes a magnetic tunnel junction including a fixed magnetic body, an insulator, and a free magnetic body sequentially stacked and a conducting wire disposed adjacent the free magnetic body of the magnetic tunnel junction to apply in-plane current. The fixed magnetic body has a fixed magnetization direction and is a thin film including a material magnetized directionally perpendicular to a film surface. The main free magnetic layer and the auxiliary free magnetic layer change in magnetization direction and is a thin film including a material magnetized directionally perpendicular to a film surface, and the main free magnetic layer is disposed adjacent to a conducting wire generating spin current by the in-plane current. Among magnetic layers constituting the free magnetic body, two magnetic layers closest to each other have opposite magnetization directions by an RKKY exchange interaction.

9 Claims, 21 Drawing Sheets

(51) Int. Cl.
   *H01L 43/06* (2006.01)
   *H01L 43/10* (2006.01)
   *H01L 43/02* (2006.01)
   *H01L 27/22* (2006.01)

(58) Field of Classification Search
   CPC . H01L 27/2409; H01L 27/2418; H01L 29/86; H01L 29/861; H01L 29/8615; H01L 29/88; H01L 43/02; H01L 43/04; H01L 43/06; H01L 43/065; H01L 43/08; H01L 43/10; H01L 43/12; H01L 43/14
   See application file for complete search history.

(56) References Cited

U.S. PATENT DOCUMENTS

| | | | |
|---|---|---|---|
| 8,416,618 | B2 | 4/2013 | Gaudin et al. |
| 8,546,896 | B2 | 10/2013 | Lottis et al. |
| 8,889,433 | B2 | 11/2014 | De Brosse et al. |
| 9,130,155 | B2 | 9/2015 | Chepulskyy et al. |
| 9,236,105 | B2 | 1/2016 | Pi et al. |
| 9,553,255 | B2 | 1/2017 | Uchida et al. |
| 10,121,824 | B2 | 11/2018 | Kinney et al. |
| 2007/0063237 | A1 | 3/2007 | Huai et al. |
| 2010/0109109 | A1 | 5/2010 | Chen et al. |
| 2012/0012953 | A1 | 1/2012 | Lottis et al. |
| 2014/0264511 | A1 | 9/2014 | De Brosse et al. |
| 2014/0264671 | A1 | 9/2014 | Chepulskyy et al. |
| 2016/0300999 | A1 | 10/2016 | Yi et al. |
| 2017/0141158 | A1 | 5/2017 | Daibou et al. |
| 2017/0345476 | A1 | 11/2017 | Doczy et al. |
| 2018/0114898 | A1 | 4/2018 | Lee |

FOREIGN PATENT DOCUMENTS

| | | |
|---|---|---|
| JP | 2013-536574 A | 9/2013 |
| JP | 2014-183319 A | 9/2014 |
| JP | 5 985 728 B1 | 9/2016 |
| JP | 6 154 745 B2 | 6/2017 |
| JP | 6 339 829 B2 | 6/2018 |
| JP | 6 393 735 B2 | 9/2018 |
| KR | 10-2014-0113174 A | 9/2014 |
| KR | 10-2015-0031280 A | 3/2015 |
| WO | WO 2008/099626 A1 | 8/2008 |
| WO | WO 2016/159017 A1 | 10/2016 |

OTHER PUBLICATIONS

Datta, S., et al., "Nanoscale device modeling: the Green's function method," Superlattices and Microstructures, vol. 28, Iss. 4, pp. 253-278 (2000).
Datta, S., Quantum transport: Atom to Transistor, Cambridge University Press, pp. 1-404 (2005).
Kovalev, A., et al., "Perpendicular spin valves with ultrathin ferromagnetic layers: Magnetoelectronic circuit investigation of finite-size effects," Physical Review B, vol. 73, No. 5, 054407, pp. 1-8 (2006).
Lee, K., et al., "Threshold current for switching of a perpendicular magnetic layer induced by spin Hall effect," Applied Physics Letters, <http://doi.org.libproxy.lib.unc.edu/10.1063/1.4798288> 102:11, 112410, pp. 1-5, dated Mar. 2013.
Ozaki, T., et al., "Efficient implementation of the nonequilibrium Green function method for electronic transport calculations," Physical Review B, vol. 81, No. 3, 035116, pp. 1-19 (2010).
Stiles, M.D., et al., "Anatomy of spin-transfer torque," Physical Review B, vol. 66, No. 1, 014407, pp. 1-14 (2002).
Taniguchi, T., "Spin transfer torques generated by the anomalous Hall effect and anisotropic magnetoresistance," Physical Review Applied, vol. 3, No. 4, 044001, pp. 1-17 (2015).
Waintal, X., et al., "Role of spin-dependent interface scattering in generating current-induced torques in magnetic multilayers," Physical Review B, vol. 62, No. 18, 12317, pp. 12 317-12 327 (2000).
Weinan, E., et al., "Simplified and improved string method for computing the minimum energy paths in barrier-crossing events," Journal of Chemical Physics, vol. 126, 164103, pp. 1-8 (2007).
Japanese Office Action for Japanese Application No. 2016-251215 dated Sep. 5, 2017.
Extended European Search Report for Application No. 17000496.4 dated Nov. 7, 2017.
Japanese Office Action for Japanese Application No. 2016-251215 dated Apr. 10, 2018.
Restriction Requirement for U.S. Appl. No. 15/474,221 dated Jun. 1, 2018.
Korean Office Action for Application No. 10-2016-0136757 dated Jul. 26, 2018.
Decision to Grant a Patent for Japanese Application No. 2016-251215 dated Jul. 30, 2018.
Korean Office Action for Application No. 10-2016-0136757 dated Jan. 22, 2019.
Non-Final Office Action for U.S. Appl. No. 15/474,221 dated Jun. 3, 2019.
Notice of Allowance for U.S. Appl. No. 15/474,221 dated Oct. 29, 2019.
Notice of Allowance for U.S. Appl. No. 15/474,221 dated Feb. 20, 2020.

Prior Art

MAGNETIC TUNNEL JUNCTION DEVICE AND MAGNETIC MEMORY DEVICE

CROSS-REFERENCE TO RELATED APPLICATION

This application is a continuation of and claims priority to co-pending U.S. patent application Ser. No. 15/474,221 filed Mar. 30, 2017, which claims priority under 35 U.S.C. § 119 to Korea Patent Application No. 10-2016-0136757 filed on Oct. 20, 2016, the entire contents of which are hereby incorporated by reference.

TECHNICAL FIELD

The present disclosure relates to a magnetic tunnel junction that may be variously used in a magnetic memory device, a magnetic logic device, a magnetic sensor or the like, and more particularly to a spin-orbit torque magnetic tunnel junction that applies in-plane current to a conducting wire to generate a spin-orbit spin torque by spin Hall effect or Rashba effect.

BACKGROUND

A ferromagnetic body means a material that is spontaneously magnetized even though a strong magnetic field is not applied thereto from the outside. In a magnetic tunnel junction structure (first magnetic body/insulator/second magnetic body) in which an insulator is interposed between two ferromagnetic bodies, an electric resistance varies depending on relative magnetization directions of two magnetic layers, i.e., a tunnel magnetoresistance effect occurs. The tunnel magnetoresistance effect occurs because up-spin and down-spin electrons flow at different degrees at the magnetic tunnel junction structure while tunneling an insulator.

According to the law of action and reaction that is Newton's third law of motion, if the magnetization direction may control a flow of current, it is also possible to control a magnetization direction of the magnetic layer by applying current due to the reaction. If current is applied to the magnetic tunnel junction structure in a direction perpendicular to a film surface, the current spin-polarized by a first magnetic body (fixed magnetic layer) transfers its spin angular momentum while passing through a second magnetic body (free magnetic layer). A torque felt by magnetization due to the transfer of spin angular momentum is called a spin transfer torque. It is possible to fabricate a device for reversing the free magnetic layer or continuously rotating the free magnetic layer using the spin transfer torque or a device for moving a magnetic domain wall of the free magnetic layer using the spin transfer torque.

Moreover, the magnetic tunnel junction may lead to magnetization reversal of a free magnetic layer or movement of a magnetic domain by using a spin-orbit spin torque generated by in-plane current flowing in a conducting wire adjacent to the free magnetic layer.

A magnetization reversal device using a spin-orbit spin torque is disclosed in U.S. Pat. No. 8,416,618 B2.

FIG. 1 is a cross-sectional view illustrating a structure of a magnetic tunnel junction using a spin-orbit spin torque according to a prior art.

Referring to FIG. 1, a magnetic tunnel junction device 10 includes a spin Hall material layer 11 and a magnetic tunnel junction connected to the spin Hall material layer 11. The magnetic tunnel junction includes a fixed magnetic layer 14, a tunnel insulating layer 13, and a free magnetic layer 12 which are sequentially stacked. The free magnetic layer 12 receives spin current from the spin Hall material layer 11 to perform magnetization reversal.

SUMMARY

Embodiments of the present disclosure provide a magnetic tunnel junction including a free magnetic body of a new structure to overcome a disadvantage in which low critical current and high thermal stability cannot be simultaneously obtained due to the problem that both critical current $I_c$ and a thermal stability factor $\Delta$ are in proportion to a thickness d of a free magnetic body in a magnetic tunnel junction structure reversing or handling a magnetization direction using a spin-orbit spin torque according to a prior art.

Embodiments of the present disclosure provide a magnetic tunnel junction using a spin-orbit spin torque that operates without an external magnetic field.

Embodiments of the present disclosure provide a magnetic memory device using a spin-orbit spin torque.

A magnetic tunnel junction device according to an example embodiment of the present disclosure includes a magnetic tunnel junction including a fixed magnetic body, an insulator, and a free magnetic body which are sequentially stacked and a conducting wire disposed adjacent to the free magnetic body of the magnetic tunnel junction to apply in-plane current to the magnetic tunnel junction. In the magnetic tunnel junction device, the fixed magnetic body may have a fixed magnetization direction and may be a thin film including a material magnetized in a direction perpendicular to a film surface. The free magnetic body may have a structure of [auxiliary free magnetic layer/free non-magnetic layer]$_N$/main free magnetic layer, where N is a positive integer greater than or equal to 2 and indicates that an [auxiliary free magnetic layers/free non-magnetic layers] structure is stacked repeatedly N times. Each of the main free magnetic layer and the auxiliary free magnetic layer may change in magnetization direction and may be a thin film including a material magnetized in a direction perpendicular to a film surface, and the main free magnetic layer may be disposed adjacent to a conducting wire generating spin current by the in-plane current.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1:
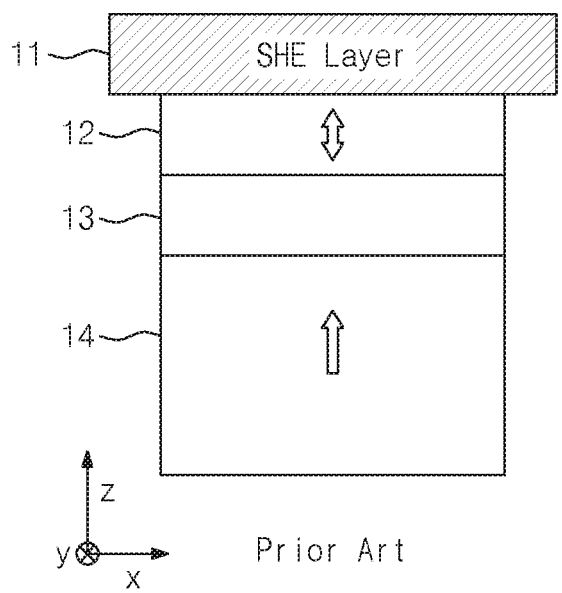
FIG. 1 is a cross-sectional view illustrating a structure of a magnetic tunnel junction using a spin-orbit spin torque according to a prior art.

According to an example embodiment of the present disclosure, a spin-orbit spin torque is generated by spin Hall effect or Rashba effect by applying in-plane current to a conducting wire adjacent to a free magnetic body magnetized in a direction perpendicular to a film surface. The spin-orbit spin torque reverses magnetization of the free magnetic body or moves a magnetic domain of a magnetic domain wall or the like in a magnetic tunnel junction. The free magnetic body has a structure of [magnetic layer/non-magnetic layer]$_N$/magnetic layer. The [magnetic layer/non-magnetic layer]$_N$ means that a [magnetic layer/non-magnetic layer] structure is repeatedly stacked N times. In the whole free magnetic body structure, two arbitrary magnetic layers closest to each other have magnetizations of opposite directions by Ruderman-Kittel-Kasuya-Yosida (RKKY) exchange interaction. A magnetic layer disposed at one end of the structure of [magnetic layer/non-magnetic layer]$_N$ is disposed adjacent to a conducting wire generating spin current, and a magnetic layer disposed at the other end thereof is disposed adjacent to an insulator.

A magnetic tunnel junction according to the present disclosure leads to magnetization reversal of a free magnetic body or movement of a magnetic domain structure by using a spin-orbit spin torque generated by in-plane current flowing in a conducting wire adjacent to the free magnetic body. Charge current flowing to the conducting wire in an in-plane direction is converted into spin current by spin-orbit coupling of the conducting wire. The spin current applies the spin-orbit spin torque to a free magnetic body adjacent to the conducting wire. As a result, it is possible to provide a device for reversing the free magnetic body or continuously rotating the free magnetic body or a device for moving a magnetic domain structure of the free magnetic body.

With respect to a free magnetic body having perpendicular magnetic anisotropy, critical current $I_c$ required for magnetization reversal of a free magnetic body by a spin-orbit spin torque generated by in-plane current flowing in the conducting wire is given by Equation (1) below [K.-S. Lee, S.-W. Lee, B.-C. Min, K.-J. Lee, Applied Physics Letters 102, 112410 (2013)].

$$I_c = \frac{2e}{\hbar} \frac{M_S dA}{\theta_{SH}} \left( \frac{H_{K,eff}}{2} - \frac{H_x}{\sqrt{2}} \right) \quad \text{Equation (1)}$$

In the Equation (1), $\hbar(=1.05\times10^{-34}$ J·s) represents a value obtained by dividing a Planck constant by $2\pi$, $e(=1.6\times10^{-19}$ C) represents charge amount of electron, $\theta_{SH}$ represents an effective spin Hall angle determined by a conductive wire material and the free magnetic body, $M_S$ represents the saturated magnetization amount of a magnetic body, d represents a thickness of the free magnetic body, A represents an area to which the in-plane current flows, $H_{K,eff}$ represents a perpendicular magnetic anisotropy field of the free magnetic body, and $H_x$ represents a magnetic field of an in-plane direction (coplanar with flow of current) which is applied to the free magnetic body.

If a size of a memory unit cell is reduced for a high-density device, a magnetization direction fluctuates randomly by thermal energy at room temperature, which is called superparamagnetic limit. The superparamagnetic limit causes written magnetic information to be erased unwantedly. Time $\tau$ for which a magnetization direction is averagely maintained against the thermal energy is given by Equation (2) below.

$$\tau = \tau_0 \exp\left(\frac{K_{eff}V}{k_B T}\right) = \tau_0 \exp\left(\frac{H_{K,eff} M_S d A_F}{2 k_B T}\right) \quad \text{Equation (2)}$$

In the Equation (2), $\tau_0$ represents a reciprocal of an attempt frequency and is approximately 1 ns, $K_{eff}$ represents an effective perpendicular magnetic anisotropy energy density ($K_{eff}=H_{K,eff}M_S/2$), V represents the volume of a free magnetic body, $A_F$ represents a cross-sectional area of the free magnetic body, $k_B$ represents a Boltzmann constant ($=1.381\times10^{-16}$ erg/K), and T represents a Kelvin temperature, where $K_{eff}V/k_B T$ is defined as a thermal stability factor $\Delta$ of a magnetic memory device. To be commercialized as a nonvolatile memory device, in general, the magnetic memory device should satisfy the condition of $\Delta$>50 at room temperature.

From the Equations (1) and (2), it can be understood that both the critical current $I_c$ of the magnetic tunnel junction and the thermal stability factor $\Delta$ increase as the thickness d of the free magnetic body increases. That is, if the free magnetic body is made thick to secure high thermal stability, more current is required for magnetization reversal. As a result, power consumption for driving a device increases. As discussed above, a magnetic tunnel junction and a magnetic memory device according to a prior art encounter the problem that both the critical current $I_c$ and the thermal stability factor $\Delta$ are in proportion to the thickness d of the free magnetic body. Accordingly, it is difficult to implement a device which satisfies both lower power driving obtained by decreasing the critical current $I_c$ and improved thermal stability obtained by increasing the thickness d of the free magnetic body.

A purpose of the present invention is to provide a magnetic tunnel junction including a free magnetic body to overcome a disadvantage in which low critical current and high thermal stability cannot be simultaneously obtained due to the problem that both critical current $I_c$ and a thermal stability factor $\Delta$ are in proportion to a thickness d of a free magnetic body in a magnetic tunnel junction structure reversing or handling a magnetization direction using a spin-orbit spin torque according to a prior art.

In a magnetic tunnel junction structure according to a prior art, critical current $I_c$ is in proportion to a thickness d of a free magnetic body. This is because spin current generating a spin-orbit spin torque is entirely absorbed at a surface of the free magnetic body. This characteristic of the spin torque is called "surface-torque characteristic". The surface-torque characteristic may be described by a spatial precession of a quantum-mechanical spin in the free magnetic body [M. D. Stiles and A. Zangwill, Physical Review B 66, 014407 (2002)]. In-plane current flowing to a conducting wire adjacent to the free magnetic body generates spin current flowing in a perpendicular direction by spin Hall effect or Rashba effect. The spin current impinges on the free magnetic body. Since up-spin and down-spin Fermi wave vectors of a magnetic body are different from each other, when a spin having a direction different from a magnetic moment direction of the free magnetic body impinges on the free magnetic body, the spin travels spatially while rapidly precessing around the magnetic moment. At this point, a spatial wavelength of the spin precession varies depending on a direction of incident electrons. Even when current flows in a solid in a specific direction in average, a direction of each of electrons constituting the current has all directions on Fermi surface of an electron band. Since spins traveling in another direction perform a precession while having different wavelengths, a spatially very fast phase difference occurs (dephasing). Considering all the above, a spin component having a different direction than the magnetic moment exists only within a fixed distance from a surface of the free magnetic body. Over the fixed distance, the spin component has the same direction as the magnetic moment. This distance is called a ferromagnetic coherence length A and is given by Equation (3) below [A. A. Kovalev, G. E. W. Bauer, A. Brataas, Physical Review B 73, 054407 (2006)].

$$\lambda_c = \frac{\pi}{|k_F^\uparrow - k_F^\downarrow|} \qquad \text{Equation (3)}$$

In the Equation (3), $k_F^\uparrow$ represents a size of up-spin Fermi wave vector of the free magnetic body and $k_F^\downarrow$ represents a size of down-spin Fermi wave vector of the free magnetic body.

The greater a size of exchange interaction of the free magnetic body (i.e., a difference between up-spin energy and down-spin energy), the greater $|k_F^\uparrow - k_F^\downarrow|$. In the case of a ferromagnetic metal such as cobalt or iron, $\lambda_c$ is less than 1 nm that is very short [X. Waintal, E. B. Myers, P. W. Brouwer, D. C. Ralph, Physical Review B 62, 12317 (2000)]. When a magnetic moment direction of the free magnetic body is referred to as $\vec{m}$ and a spin direction of the spin current in the free magnetic body is referred to as $\vec{s}$, the spin torque is in proportion to $\vec{m} \times \vec{s}$. The spin direction $\vec{s}$ includes an $\vec{m} \times \hat{y}$ component and a $\hat{y}$ component. The $\vec{m} \times \hat{y}$ component determines a magnetization reversal. That is, among the spin torque components, the $\vec{m} \times \hat{y}$ component determines magnetization reversal. Due to the reason described above, the spin direction $\vec{s}$ of the spin current in the ferromagnetic body is different from the magnetic moment direction $\vec{m}$ only at a distance within $\lambda_c$ from the surface of the free magnetic body. Therefore, a spin-orbit spin torque in the free magnetic body including the ferromagnetic body has a non-zero value only on the surface of the free magnetic body and thus is a surface torque applied only to the surface of the free magnetic body. Due to the surface torque characteristic, a size of the spin-orbit spin torque is not changed even when the thickness d of the free magnetic body increases. Instead, since the volume of the magnetic body whose magnetization direction should be moved by the spin torque increases, the critical current $I_c$ is in proportion to the thickness d of the free magnetic body.

To overcome the problem that the critical current $I_c$ is in proportion to the thickness d of the free magnetic body, there is proposed a structure in which a free magnetic body includes a plurality of magnetic layers and a magnetic moment of each of the magnetic layers is repeatedly reversed in a current flow direction. More specifically, a proposed free magnetic body has a structure in which [magnetic layer/non-magnetic layer] is repeated and magnetization directions of closest two magnetic layers are opposite to each other due to an RKKY exchange interaction through a non-magnetic layer. Due to the structure in which magnetizations of opposite directions are repeated arranged, an effective energy difference of up-spin and down-spin in the free magnetic layer is reduced. The reduction in the effective energy difference causes effective $|k_F^\uparrow - k_F^\downarrow|$ of the entire free magnetic body to be reduced. Since a ferromagnetic coherence length $\lambda_c$ is in proportion to $1/|k_F^\uparrow - k_F^\downarrow|$, a coherence length $\lambda_c$ in the structure in which magnetizations of opposite directions are repeated is much longer than a coherence length $\lambda_c$ of an existing free magnetic body having magnetizations of one direction. As a result, the surface torque characteristic disappears and a bulk-torque characteristic emerges. Due to the bulk-torque characteristic, when a thickness d of the free magnetic body increases, a size of the spin-orbit spin torque increases in a similar proportion. Thus, although the thickness d of the free magnetic body increases, the increase in the thickness d may not be great or the critical current $I_c$ may be irrelevant to the thickness d in the ideal case.

A simulation was performed to confirm that a bulk-torque characteristic was exhibited in a proposed novel free magnetic body structure.

A magnetic tunnel junction according to example embodiments of the present disclosure uses a characteristic in which, when current flows in an in-plane direction along a conducting wire adjacent to a free magnetic body, spin current generated by spin Hall effect or Rashba effect is not entirely absorbed to a surface of the free magnetic layer but is relatively uniformly absorbed at the total thickness of the free magnetic body. Thus, efficiency of the spin-orbit torque is not in inverse proportion to a thickness of the free magnetic body and is relatively irrelevant to the thickness of the free magnetic body. To this end, the free magnetic body has a structure of [magnetic layer/non-magnetic layer]$_N$/magnetic layer, where N is the repeated number of a [magnetic layer/non-magnetic layer] unit structure. If the total thickness of the free magnetic body increases by increasing N, the total magnetic volume increases to improve thermal stability. Thus, both high thermal stability and low critical current may be secured. As a result, although a magnetic tunnel junction having a very small cross-sectional area is used, the total thickness of the free magnetic body may increase to secure non-volatility (e.g., thermal stability factor $\Delta$>50) and to secure low critical current using a characteristic in which a spin torque is uniformly absorbed at the whole of thickness. Accordingly, an ultrahigh-density nonvolatile device with low power driving and high thermal stability may be implemented.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

Figure 2A:
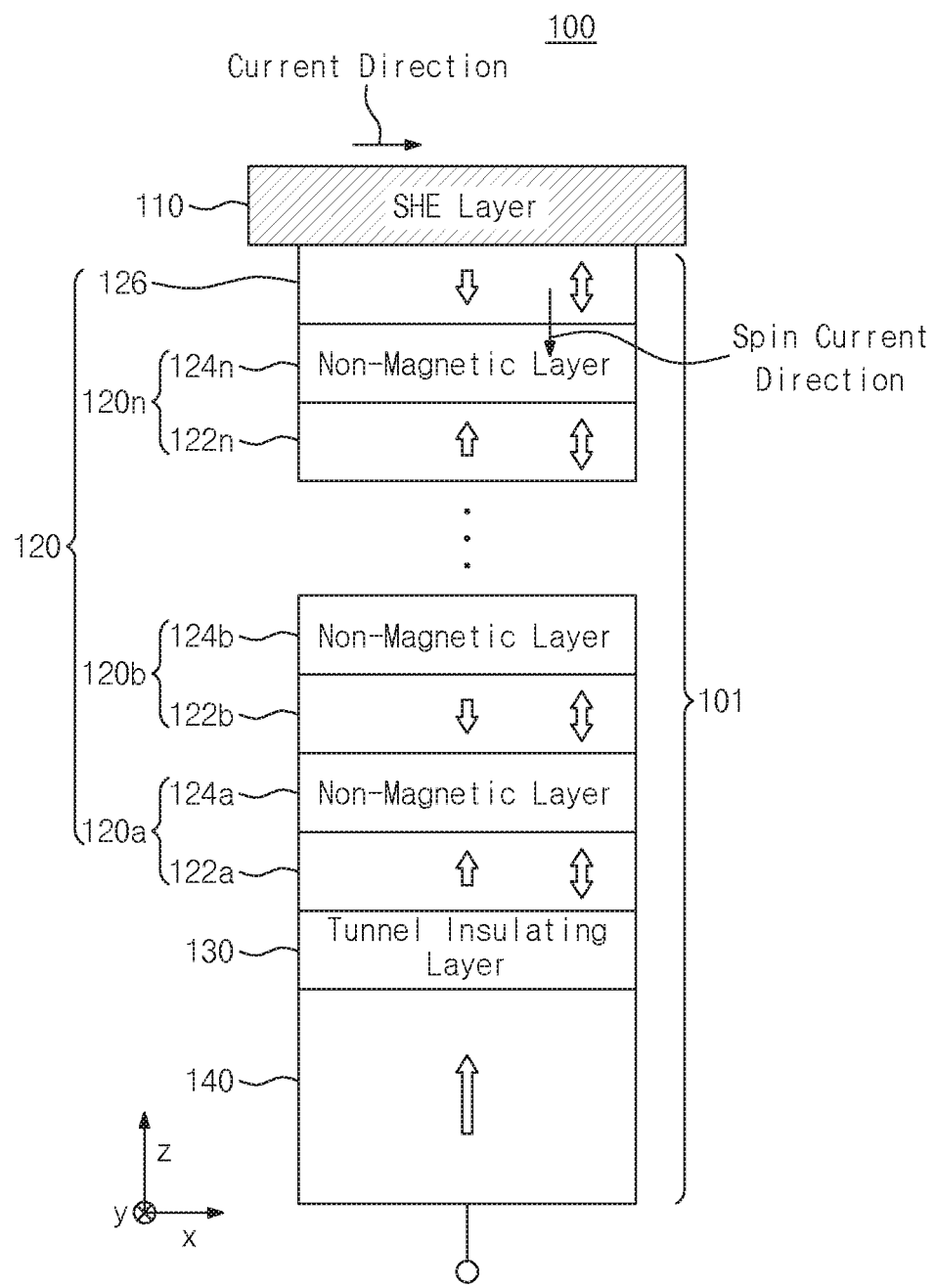
FIGS. 2A and 2B are conceptual diagrams illustrating magnetization directions of a magnetic tunnel junction and a free magnetic layer according to an example embodiment of the present disclosure.
Figure 2B:
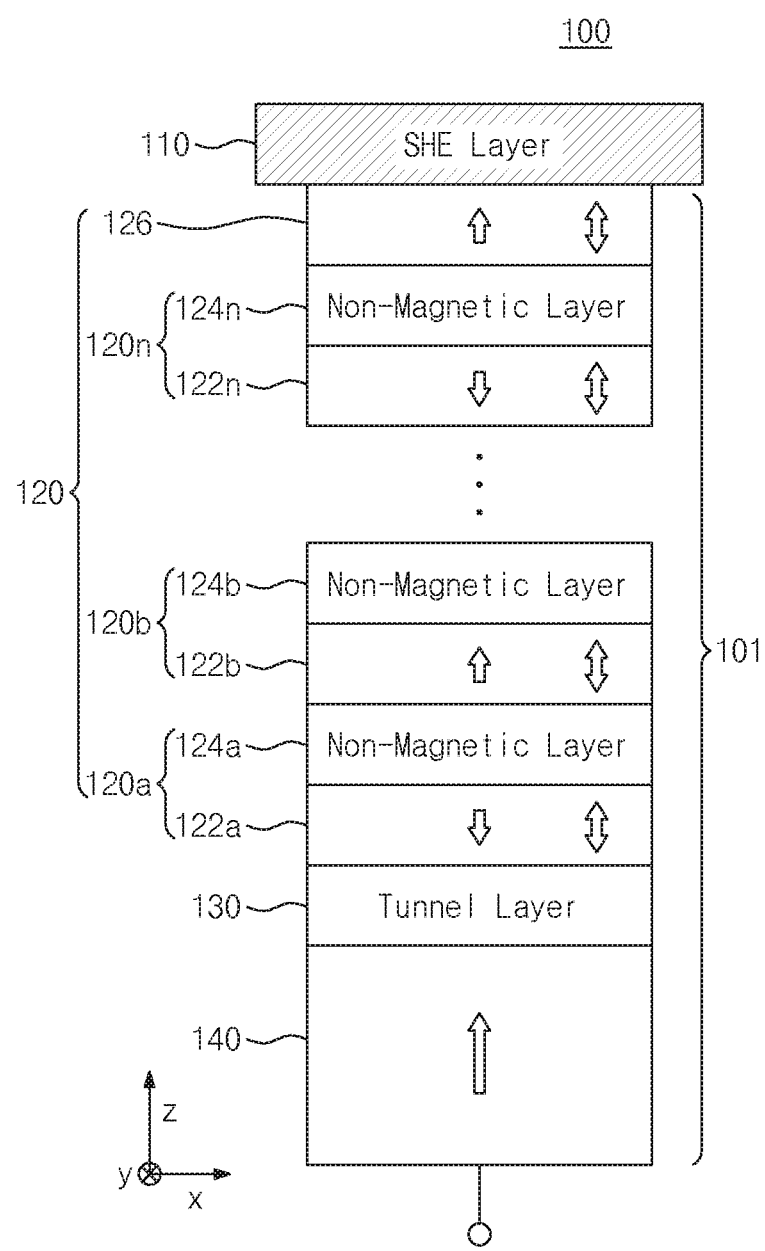

FIGS. 2A and 2B are conceptual diagrams illustrating magnetization directions of a magnetic tunnel junction and a free magnetic layer according to an example embodiment of the present disclosure.

Referring to FIGS. 2A and 2B, a magnetic tunnel device 100 includes a magnetic tunnel junction 101 including a fixed magnetic body 140, an insulator 130, and a free magnetic body 120 which are sequentially stacked and a conducting wire 110 disposed adjacent to the free magnetic body 120 of the magnetic tunnel junction 101 to apply in-plane current to the magnetic tunnel junction 101.

A magnetic field established from the outside of the free magnetic body 120 may be applied to the free magnetic body 120 or a structure of the magnetic tunnel device 100 may be changed to replace the external magnetic field.

The fixed magnetic body 140 is a thin film that has a fixed magnetization direction and is magnetized in a direction perpendicular to a film surface. The free magnetic body 120 has a structure of [auxiliary free magnetic layers 122a to 122n/free non-magnetic layers 124a to 124n]$_N$/main free magnetic layer 126, where N is a positive integer greater than or equal to 2 and indicates that an [auxiliary free magnetic layers 122a to 122n/free non-magnetic layers 124a to 124n] structure (120a to 120n) is stacked repeatedly N times. Each of the main free magnetic layer 126 and the auxiliary free magnetic layers 122a to 122n is a thin film that changes in magnetization direction and is magnetized in a direction perpendicular to a film surface. The main free magnetic layer 126 is disposed adjacent to the conducting wire 110 that generates spin current due to the in-plane current.

The conducting wire 110 manifests a spin-orbit spin torque due to spin Hall effect or Rashba effect by the in-plane current flowing in an in-plane direction. The spin-orbit spin torque reverses a magnetization of the free magnetic body 120 or moves a magnetic domain structure. The conducting wire 110 may be a single layer or a multi-layered structure including different materials. The conducting wire 110 may include at least one of Cu, Ta, Pt, W, Bi, Ir, Mn, Ti, Cr, and a combination thereof. The conducting wire 110 may be a heavy metal such as β-Ta, Pt, β-W, Pd or Cr. The conducting wire 110 may be doped with an impurity such as oxygen.

The magnetic tunnel junction 101 may include the fixed magnetic body 140, the insulator 130, and the free magnetic body 120 that are sequentially stacked. The magnetic tunnel junction 101 may be variously changed so long as it includes a free magnetic body.

The insulator 130 may include a tunnel insulating layer. The insulator 130 may be a thin film formed of a material including at least one of AlO$_x$, MgO, TaO$_x$, ZrO$_x$, and a combination thereof.

The fixed magnetic body 140 may include a ferromagnetic material and may include at least one of Fe, Co, Ni, B, Si, Zr, and a combination thereof. More specifically, the fixed magnetic body 140 may be Co, CoFe, CoFeB, CoNi or NiFe.

The fixed magnetic body 140 may have a synthetic antiferromagnetic structure including a first fixed magnetic layer, a fixed non-magnetic layer, and a second fixed magnetic layer that are sequentially stacked. Each of the first and second fixed magnetic layers may independently include at least one of Fe, Co, Ni, B, Si, Zr, and a combination thereof, and the fixed non-magnetic layer may include at least one of Ru, Ta, Cu, and a combination thereof.

The fixed magnetic body 140 may be an exchange-biased antiferromagnetic structure including an antiferromagnetic layer, a first fixed magnetic layer, a fixed non-magnetic layer, and a second fixed magnetic layer that are sequentially stacked. The antiferromagnetic layer may be formed of a material including at least one of Ir, Pt, Mn, and a combination thereof. Each of the first and second fixed magnetic layers may include a ferromagnetic material and may be independently formed of a material including Fe, Co, Ni, B, Si, Zr, and a combination thereof. The fixed non-magnetic layer may be formed of a material including at least one of Ru, Ta, Cu, and a combination thereof.

The free magnetic body 120 has a structure in which a unit structure 120a including [auxiliary free magnetic layer 122a/free non-magnetic layer 124a] is repeated N times, and two auxiliary free magnetic layers closest to each other (e.g., 122a and 122b) have magnetic moments (magnetizations) of opposite directions by Ruderman-Kittel-Kasuya-Yosida (RKKY) exchange interaction through the free non-magnetic layer 124a. Due to the same reason, the magnetization direction of the main free magnetic layer 126 is opposite to that of the closest auxiliary free magnetic layer 122n.

The auxiliary free magnetic layers 122a to 122n all have perpendicular magnetic anisotropy and a magnetization direction perpendicular to a plane, and adjacent auxiliary magnetic layers have opposite magnetization directions. In addition, the main free magnetic layer 126 and an auxiliary free magnetic layer 122n closest to the main free magnetic layer 126 have different magnetization directions. Magnetizations of the auxiliary free magnetic layer 122a to 122n and the main free magnetic layer 126 may be simultaneously reversed by the spin current.

The free magnetic body 120 may have a structure in which [auxiliary free magnetic layers 122a to 122n/free non-magnetic layers 124a to 122n] is repeatedly stacked two or more times.

The auxiliary free magnetic layers 122a to 122n and the main free magnetic layer 126 may be formed of different materials or have different thicknesses, respectively. For example, the auxiliary free magnetic layer 122a adjacent to the tunnel insulating layer 130 determines a tunnel magnetic resistance of the magnetic tunnel junction 101. The tunnel magnetic resistance determines a size of a regenerative signal of a magnetic device including the magnetic tunnel junction 101. Therefore, the higher the tunnel magnetic resistance, the more advantageous device driving. As a result, a material and a thickness of the auxiliary free magnetic layer 122a may be different from those of the other auxiliary free magnetic layers 122b to 122n and 126 to have a high tunnel magnetic resistance. In addition, the main free magnetic layer 126 adjacent to the conducting wire 110 may have an influence on the intensity of spin current impinging on the free magnetic body 120 by interface effect. Thus, the material and the thickness of the main free magnetic layer 126 may be different from those of the auxiliary free magnetic layers 122a to 122n to secure a large spin torque. In addition, magnetization reversal or magnetic domain driving efficiency may be improved by differentiating materials or thicknesses of two magnetic layers closest to each other (e.g., (122a and 122b) or (122c and 122d) or (122n and 126)).

Specifically, the auxiliary free magnetic layer 122a adjacent to the tunnel insulating layer 130 may include CoFeB, and other magnetic layers in the other free magnetic body 120 may include CoFe, Co or the like. Alternatively, the thickness of the auxiliary free magnetic layer 122a adjacent to the tunnel insulating layer 130 may be greater than 1 nm to secure a high tunnel magnetic resistance. Alternatively, other magnetic layers in the free magnetic body 120 except for the auxiliary free magnetic layer 122a may be less than 1 nm, which is smaller than a ferromagnetic coherence length $\lambda_c$, to manifest a bulk-torque characteristic.

Electrons of up-spin and down-spin constituting in-plane charge current flowing in an x axis direction in the conducting wire 110 are deflected in a different direction (e.g., y axis direction) by spin-orbit interaction. Spin currents are generated in all directions perpendicular to the in-plane charge current direction. In this case, the spin current generated in all the directions have spin components deflected in directions perpendicular to all the directions.

When the in-plane current in the conducting wire 110 flows in the x axis direction, among the generated spin currents, −z axis component (spin current impinging on a free magnetic body) has a spin component $\vec{s}$ of y direction or −y direction according to types of materials of the conducting wire 110 and the adjacent main free magnetic layer 126 and flows into the free magnetic body 120. Due to the spin current flowing into the free magnetic body 120, the free magnetic body 120 receives a spin-orbit spin torque.

A direction of the spin-orbit spin torque made by the spin current impinging on the free magnetic body 120 is $\vec{m} \times \vec{s}$. The $\vec{m}$ is a magnetization direction of a free magnetic layer, and the $\vec{s}$ includes a $\vec{m} \times \hat{y}$ component and a $\hat{y}$ component. The $\vec{m} \times \hat{y}$ component determines magnetization reversal. Since the $\vec{m}$ has perpendicular magnetic anisotropy and is a z-axis direction, the $\vec{m} \times \hat{y}$ is an x axis direction. Accordingly, an x axis direction component of the $\vec{s}$ may reverse a magnetization of the free magnetic layer or may move a magnetic domain structure. The direction of the spin component $\vec{s}$ may be changed according to the direction of the in-plane current to reverse the magnetization of the free magnetic layer.

Figure 3:
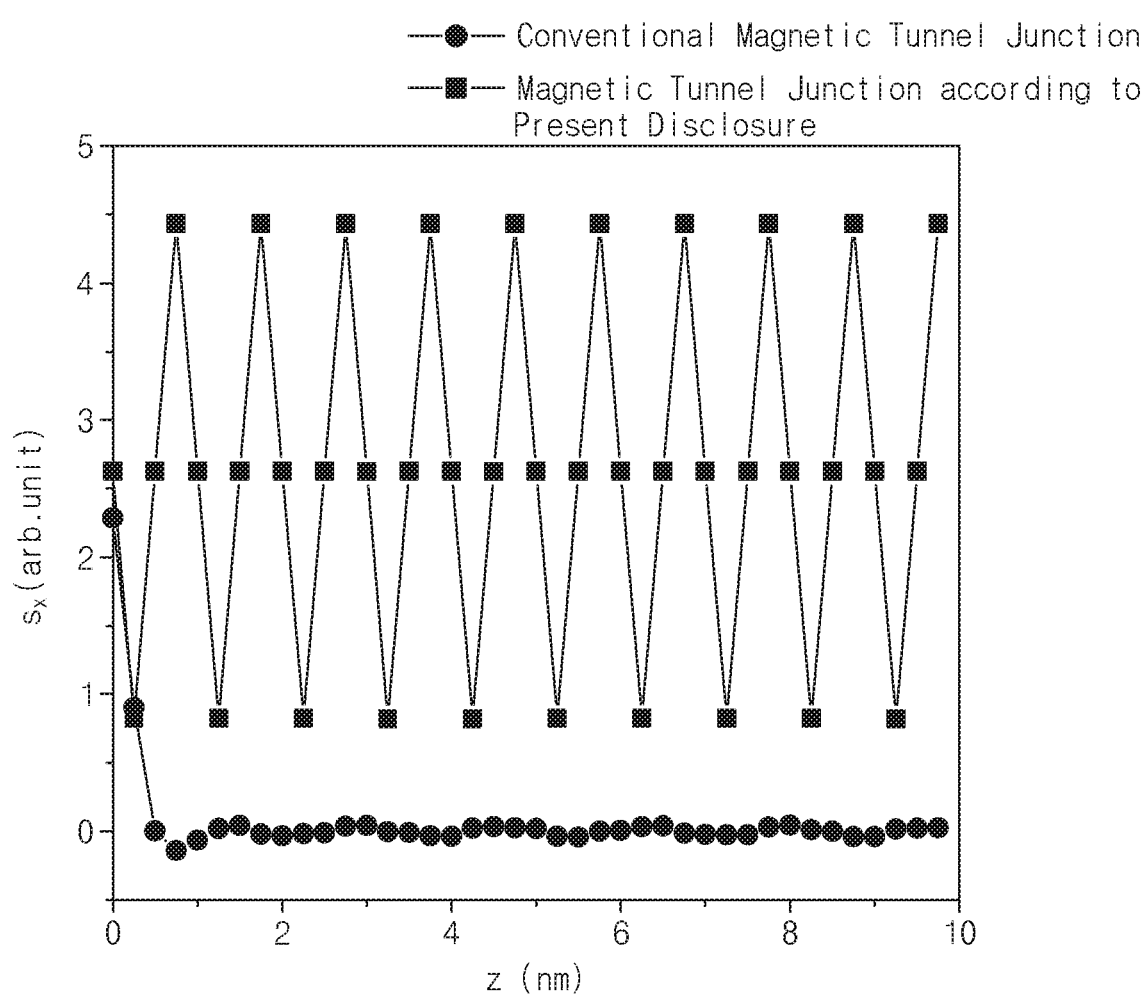
FIG. 3 illustrates x-direction component $s_x$ of spin current of a magnetic tunnel junction according to a prior art and a magnetic tunnel junction according to an example embodiment of the present disclosure.

FIG. 3 illustrates x-direction component sx of spin current of a magnetic tunnel junction according to a prior art and a magnetic tunnel junction according to an example embodiment of the present disclosure.

Referring to FIGS. 2A and 2B, a magnetic tunnel junction 101 includes a free magnetic body 120 having a structure in which a unit structure 120a including [auxiliary free magnetic layer 122a/free non-magnetic layer 124a] are repeated N times.

FIG. 3 illustrates the x-direction component $s_x$ of the spin current calculated quantum-mechanically based on the non-equilibrium Green's function (NEGF) technique with respect to a thickness-direction axis (z-axis) of a free magnetic body. The $s_x$ is a local value calculated at a specific z, and a boundary between the free magnetic body 120 and the conducting wire 110 is disposed at z=0.

Referring to FIG. 1, in the case of the existing magnetic tunnel junction 10, a ferromagnetic coherence length $\lambda_c$ is very short. Therefore, a spin component $s_x$ is almost zero within a period shorter than 1 nm from a surface of a free magnetic body (z=0). This means that a spin-orbit spin torque is a surface torque at the existing magnetic tunnel junction.

Referring to FIG. 2, in the case of the magnetic tunnel junction 100 according to the present disclosure, it can be understood that a spin component determining a spin-orbit spin torque is maintained in a non-zero state to a distance further away from a surface of a free magnetic body (z=0). This means that at the magnetic tunnel junction 100 according to the present disclosure, the spin-orbit spin torque is a bulk torque.

Figure 4:
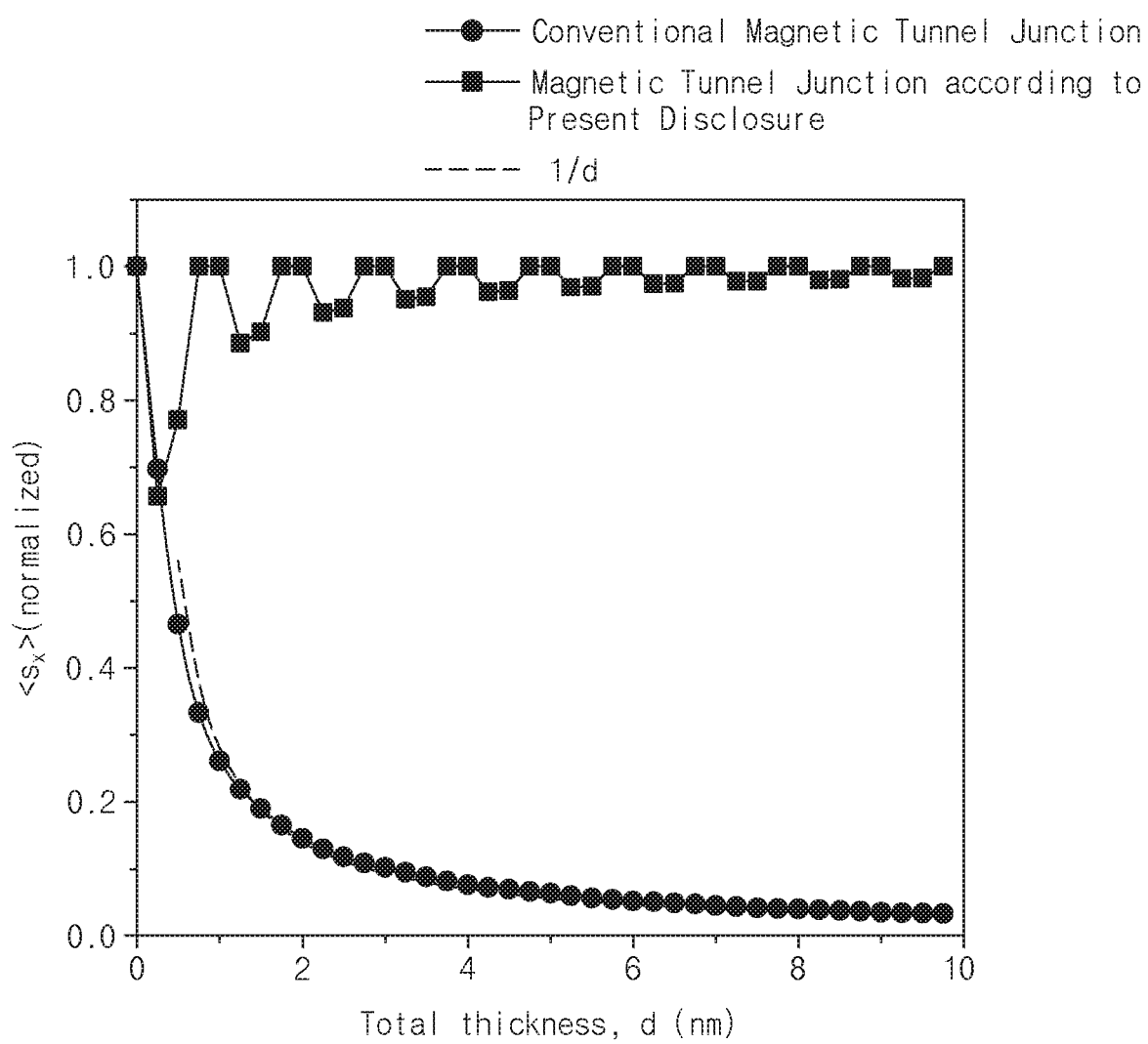
FIG. 4 is a graph depicting a thickness average of the spin x-direction component in FIG. 3.

FIG. 4 is a graph depicting a thickness average of the spin x-direction component in FIG. 3.

FIG. 4 illustrates the local spin component $s_x$ in FIG. 3 with reference to an average ($=<s_x>$) of the total thickness of free magnetic bodies having different thicknesses. The $<s_x>$ is defined as below.

$$\langle s_x \rangle = \frac{1}{d} \int_{z=0}^{z=d} s_x dz \quad \text{Equation (4)}$$

The $<s_x>$ is in proportion to total spin-orbit spin torque that is actually felt by a free magnetic body having a thickness d.

Referring to FIG. 1, in the existing magnetic tunnel junction 10, a ferromagnetic coherence length $\lambda_c$ is very short. Therefore, the $<s_x>$ has a dependency of 1/d. That is, when the thickness d of the free magnetic body increases, spin torque efficiency decreases by about 1/d.

Referring to FIGS. 2A and 2B, in the case of the magnetic tunnel junction 100 according to the present disclosure, a dependency of $<s_x>$ on d almost does not exist. This means that spin torque efficiency is maintained even when the thickness d of the free magnetic body increases.

Hereinafter, quantum-mechanical modeling will now be described based on the non-equilibrium Green's function (NEGF) technique.

Characteristics of a spin-orbit spin torque at a magnetic tunnel junction according to the present disclosure were confirmed based on the non-equilibrium Green's function (NEGF) technique through quantum-mechanical modeling [S. Datta, Superlattice and Microstructures 28, 4 (2000); S. Datta, Quantum transport: atom to transistor. Cambridge University Press (2005)]. Tight-binding Hamiltonian H was used for an existing magnetic tunnel junction structure of [spin polarization layer SP/non-magnetic body NM/free magnetic body (magnetic layer) FM] and a magnetic tunnel junction structure according to the present disclosure in which [spin polarization layer SP/non-magnetic body NM/free magnetic body ([magnetic layer FM/non-magnetic layer NM])] is repeated. The tight-binding Hamiltonian H is given by Equations (5) to (7).

$$H_{SP} = -t \sum_{<i,j>} a_i^\dagger a_j - \Delta_{SP} \sum_i a_i^\dagger (\vec{\sigma} \cdot \vec{m}_i) a. \quad \text{Equation (5)}$$

$$H_{NM} = -t \sum_{<i,j>} a_i^\dagger a_j \quad \text{Equation (6)}$$

$$H_{FM} = -t \sum_{<i,j>} a_i^\dagger a_j - \Delta_{FM} \sum_i a_i^\dagger (\vec{\sigma} \cdot \vec{m}_i) a_i \quad \text{Equation (7)}$$

In the Equations (5) to (7), $H_{SP}$, $H_{NM}$, and $H_{FM}$ represent Hamiltonians of layers, respectively; t represents a hopping constant, i and j represent site indexes, respectively; $\alpha^\dagger$ represents a creation operator; $\alpha$ represents an annihilation operator; $\Delta_{SP}$ represents exchange interaction energy of a spin polarization layer; $\vec{\sigma}$ represents a Pauli spin matrix; and $\vec{m}$ represents a unit vector of polarization direction. At this point, $\Delta_i$ represent JS of an i layer, J represents a size of exchange interaction between an angular momentum $\vec{s}$ of magnetization and a non-equilibrium spin density $\vec{s}$ by current, and S represents $\vec{s}$.

In the modeling, a spin polarization layer and a free magnetic body infinite to one side were considered by applying a surface Green's function [T. Ozaki, K. Nishio, H. Kino, Physical Review B 81, 035116 (2010)] to a self-energy matrix $\Delta_{L,R}$. From the above-mentioned Hamiltonian and self-energy matrix, the spin density is given by Equations (8) to (10).

$$G(E) = [EI - (H + \Lambda_L + \Lambda_R)]^{-1} \quad \text{Equation (8)}$$

$$\rho = \frac{1}{2\pi} \int_{-\infty}^{\infty} G^n(E) dE \quad \text{Equation (9)}$$

$$\vec{s} = \frac{\hbar}{2} Tr[\vec{\sigma} \cdot \vec{\delta\rho}] \quad \text{Equation (10)}$$

In the Equations (8) to (10), G represents a Green's function, E represents energy, I represents a unit matrix, $G^n$ represents a correlation function, $\rho$ represents an electron density, and $\vec{\delta\rho}$ represents a non-equilibrium electron density depending on application of a voltage.

To simulate that spin current depending on spin Hall effect or Rashba effect of a conducting wire has a spin of y direction, the magnetization of the spin polarization layer was set to the y direction. In the case of the existing magnetic tunnel junction 10, a magnetization direction in all sites of the free magnetic body was set to +z direction. In the case of the magnetic tunnel junction 100 according to an example embodiment of the present disclosure, a magnetization of an odd one of magnetic layers constituting a free magnetic body was set to +z direction and a magnetization of an even magnetic layer was set to −z direction.

Experimental Example 1

Spatial Variation of Non-Equilibrium Spin Density of x Component in Free Magnetic Body of Magnetic Tunnel Junction According to the Present Disclosure (1) FIG. 3 illustrates an x-direction component $s_x$ of spin current calculated quantum-mechanically based on the non-equilibrium Green's function (NEGF) technique for the existing magnetic tunnel junction 10 and the magnetic tunnel junction 100 according to the present disclosure with respect to a thickness-direction axis (z-axis) of a free magnetic body. The spin component $s_x$ is a value calculated at specific z, and a surface of the free magnetic body is disposed at z=0.

(2) Physical property values are as follows:
Lattice spacing=0.25 nm, thickness of magnetic layer constituting free magnetic layer=0.25 nm, thickness of non-magnetic layer constituting free magnetic body=0.25 nm, thickness disposed outside the free magnetic body=2.5 nm, Hopping constant t=1.0 eV, electronic mass=9.1×10⁻³¹ kg, exchange energy of spin polarization layer=0.8 eV, exchange energy of magnetic layer constituting the free magnetic body=0.8 eV, and Fermi energy=4.1 eV.

(3) Referring to FIG. 3, in the case of the existing magnetic tunnel junction 100, a ferromagnetic coherence length $\lambda_c$ is very short. Therefore, the spin component is almost zero within a period shorter than 1 nm from a surface of the free magnetic body (z=0). This means that a spin-orbit spin torque is a surface torque at the existing magnetic tunnel junction 100.

Meanwhile, in the case of the magnetic tunnel junction 100 according to the present disclosure, $s_x$ determining a spin torque is maintained in a non-zero state to a distance further away from a surface of a free magnetic body (z=0). This means that a spin-orbit spin torque is a bulk torque at the magnetic tunnel junction 200.

Experimental Example 2

Relationship Between Entire Spin-Orbit Spin Torque Applied to Free Magnetic Body of Magnetic Tunnel Junction According to the Present Disclosure and Thickness of the Free Magnetic Body (1) FIG. 4 illustrates the local $s_x$ in FIG. 3 with reference to an average of the total thickness of free magnetic bodies having different thicknesses. The $<s_x>$ is defined by Equation (4) and is in proportion to the entire spin-orbit spin torque felt actually by a free magnetic body having a thickness d.

(2) Physical property values are identical to those in Experimental Example 1.

(3) Referring to FIG. 4, in the case of the existing magnetic tunnel junction 10, $<s_x>$ has a dependency of 1/d. That is, when a thickness d of the free magnetic body increases, spin torque efficiency decreases by about 1/d.

Meanwhile, in the case of the magnetic tunnel junction 100 according to the present disclosure, a dependency of $<s_x>$ on d almost does not exist. This means that spin torque efficiency is maintained even when the thickness d of the free magnetic body increases.

A dependency of critical current $I_c$ on a thickness of a free magnetic body at a magnetic tunnel junction according to the present disclosure was confirmed through micromagnetics. An equation of motion of magnetization is given by Equation (11).

$$\frac{\partial \hat{m}}{\partial t} = -\gamma \hat{m} \times \vec{H}_{eff} + \alpha \hat{m} \times \frac{\partial \hat{m}}{\partial t} + \vec{N}_{SOT} \quad \text{Equation (11)}$$

In the Equation (11), $\gamma$ represents a magnetic rotational constant, $H_{eff}$ represents all effective magnetic field vectors of a free magnetic field 103 or 203, a represents a Gilbert damping constant, and $N_{SOT}$ represents a spin-orbit spin torque.

Experimental Example 3

Figure 5:
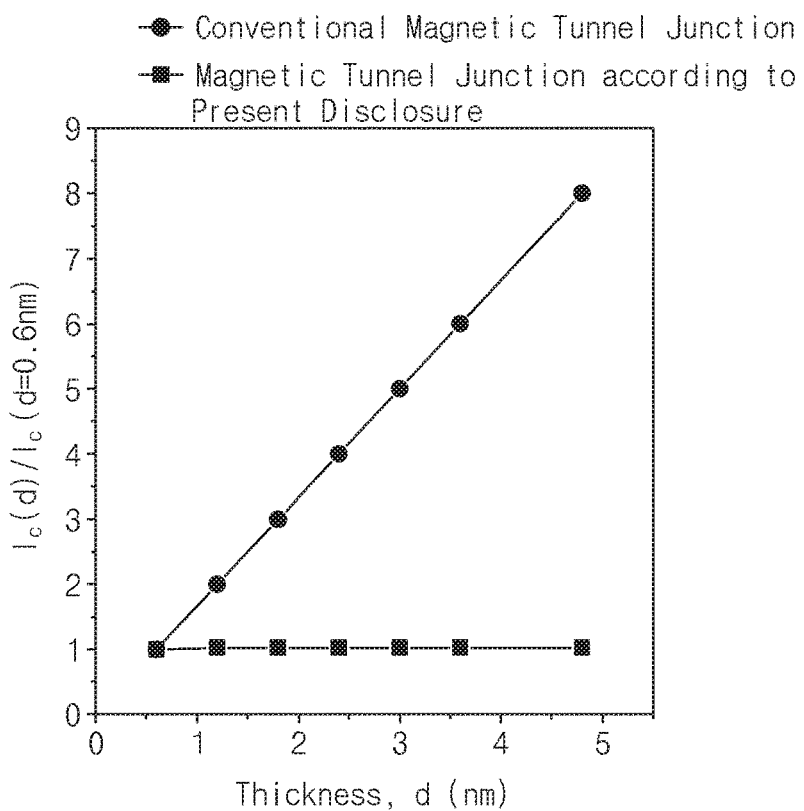
FIG. 5 illustrates variation of critical current $I_c$ for magnetization reversal depending on a thickness d of a free magnetic body in an existing magnetic tunnel junction and a magnetic tunnel junction according to the present disclosure.

Variation of Critical Currently Depending on a Thickness d of a Free Magnetic Body With Respect to a Magnetic Tunnel Junction According to the Present Disclosure FIG. 5 illustrates variation of critical current $I_c$ for magnetization reversal depending on a thickness d of a free magnetic body in an existing magnetic tunnel junction and a magnetic tunnel junction according to the present disclosure.

Referring to FIG. 5, in the case of an existing magnetic tunnel junction 10, critical current $I_c$ is in proportion to a thickness d. This result is obtained because spin torque efficiency has a dependency of 1/d, which is identical to a result estimated by the Equation (1).

Meanwhile, in the case of a magnetic tunnel junction 100 according to the present disclosure, a constant result is obtained under the state that $I_c$ is almost independent of d. This means that the intensity of current required to reverse magnetization or to move a magnetic domain structure almost does not change even when a thickness of a free magnetic body increases.

(1) FIG. 5 illustrates variation of critical current $I_c$ for magnetization reversal depending on a thickness d of a free magnetic body in an existing magnetic tunnel junction 10 and a magnetic tunnel junction 100 according to the present disclosure. As shown in FIG. 5, the critical current $I_c$ is normalized as critical current at a thickness of d=0.6 nm. In the case of the existing magnetic tunnel junction 10, a surface torque characteristic (a non-equilibrium spin density is zero not only on a surface of a free magnetic body but also at other portions) was assumed. In the case of the magnetic tunnel junction 100 according to the present disclosure, a bulk torque characteristic (a non-equilibrium spin density is spatially uniform) was assumed.

(2) A structure of a device and physical property values are as follows.

Cross-sectional area of free magnetic body=30×30 nm².

Common physical property of magnetic layer constituting the existing magnetic tunnel junction 10 and magnetic layer constituting the magnetic tunnel junction 100 according to the present disclosure: "saturated magnetization value ($M_S$) =1000 emu/cm³, Gilbert damping constant (α)=0.02, perpendicular magnetic anisotropy energy (K)=7.2×10⁶ erg/cm³, and effective spin Hall angular absolute value ($|\theta_{SH}|$) =0.1"

Physical property applied to only magnetic layer constituting free magnetic layer of the magnetic tunnel junction 100 according to present disclosure: "thickness of each magnetic layer=0.3 nm, and RKKY exchange energy between magnetic layers closest to each other=2.5×10⁻⁷ erg/cm".

(3) Referring to FIG. 5, in the case of the existing magnetic tunnel junction 10, critical current $I_c$ is in proportion to d. This result is obtained because spin torque efficiency has a dependency of 1/d, which is identical to a result estimated by the Equation (1).

Meanwhile, in the case of the magnetic tunnel junction 100 according to the present disclosure, a constant result is obtained under the state that $I_c$ is almost independent of d. This means that the intensity of current required to reverse magnetization or to move a magnetic domain structure almost does not change even when a thickness of a free magnetic body increases.

Figure 6:
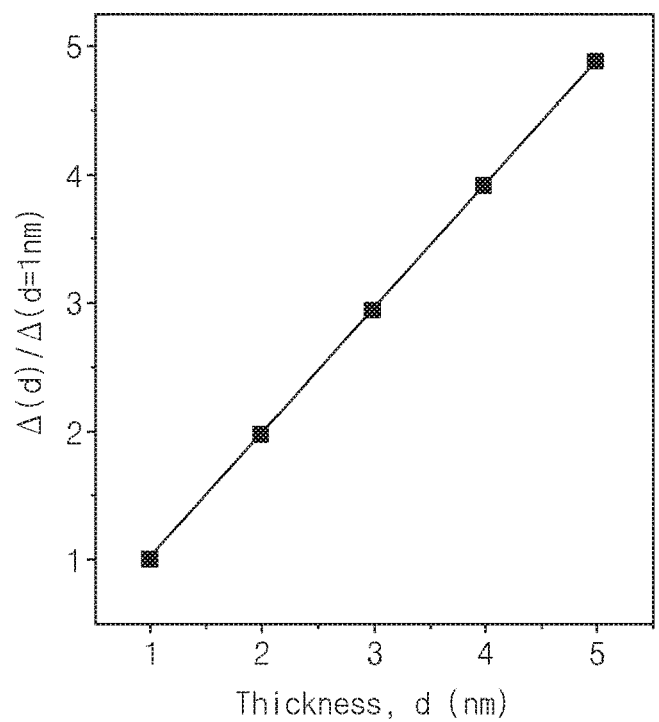
FIG. 6 illustrates variation of a thermal stability factor $\Delta$ depending on a thickness d of a free magnetic body in a magnetic tunnel junction according to the present disclosure.

FIG. 6 illustrates variation of a thermal stability factor Δ depending on a thickness d of a free magnetic body in a magnetic tunnel junction according to the present disclosure.

Referring to FIG. 6, since the entire magnetic volume V increases if a thickness of a free magnetic body 120 increases, a thermal stability factor Δ increases proportionally.

Referring to FIGS. 5 and 6, in the case of a magnetic tunnel junction according to an example embodiment of the present disclosure, a thermal stability factor Δ increases as a thickness d of a free magnetic body increases. However, critical current $I_c$ is constant irrespective of d. Accordingly, when the magnetic tunnel junction according to an example embodiment of the present disclosure is used as a smaller-sized memory or logic device cell, it is driven at low current while keeping non-volatility. This characteristic makes a low-power ultrahigh-density nonvolatile device possible.

A dependency of a thermal stability factor Δ at a magnetic tunnel junction according to the present on a thickness of a free magnetic body was confirmed through a streaming technique [E. Weinan, W. Ren, E. Vanden-Eijnden, Journal of Chemical Physics 126, 164103 (2007)]. To obtain an energy barrier $E_B$ that determines the thermal stability factor Δ, a transition path between two energy minimum states (case that all magnetizations are in +z direction and case that all magnetizations are in −z direction) was set first. The entire transition path was divided into 100 images. Since this initial transition path is not a minimum energy path, a minimum energy path for each $i^{th}$ image after passage of a time δt was obtained through Equation (12).

$$\vec{m}_i(t+\delta t)=\vec{m}_i(t)-\int_t^{t+\delta t}\gamma\vec{m}\times(\vec{m}\times\vec{H}_{eff})dt \qquad \text{Equation (12)}$$

In the Equation (12), γ represents a gyromagnetic constant and $H_{eff}$ represents all effective magnetic field vectors. Through each image converging on time, $E_B$ was determined. The thermal stability factor Δ was determined to be $E_B/k_BT$ at room temperature (T=300 K).

Experimental Example 4

Variation of Thermal Stability Factor Δ Depending on Thickness d of Free Magnetic Body with Respect to Magnetic Tunnel Junction According to the Present Disclosure (1) FIG. 6 illustrates variation of a thermal stability factor Δ depending on a thickness d of a free magnetic body in a magnetic tunnel junction 100 according to the present disclosure. As shown in FIG. 6, the thermal stability factor Δ is normalized as Δ at thickness of d=1.0 nm.

(2) Structure and physical property values of device are identical to those in Experimental Example 3.

(3) Referring to FIG. 6 below, in the case of a magnetic tunnel junction 200 according to the present disclosure, a thermal stability factor Δ is in linear proportion to d. Since the entire magnetic volume V increases if a thickness of a free magnetic body increases, the thermal stability factor Δ increases proportionally. Therefore, this result is obtained.

The same explanations as those in FIGS. 2 to 6 will be omitted.

Figure 7:
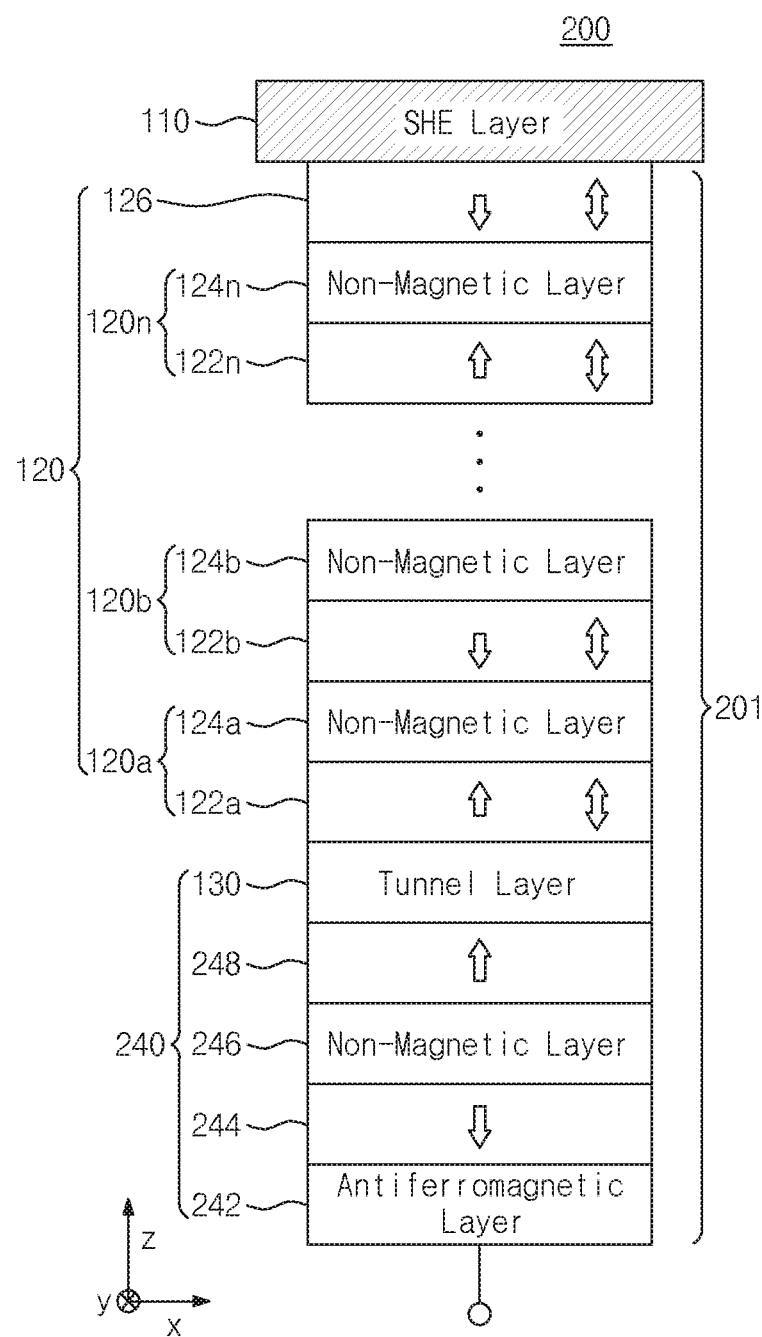
FIGS. 7 through 14 illustrate magnetic tunnel junction devices according to example embodiments of the present disclosure.

FIG. 7 illustrates a magnetic tunnel junction device according to an example embodiment of the present disclosure.

Referring to FIG. 7, a magnetic tunnel junction device 200 includes a magnetic tunnel junction 201 including a fixed magnetic body 240, an insulator 130, and a free magnetic body 120 that are sequentially stacked and a conducting wire 110 disposed adjacent to the free magnetic body 120 of the magnetic tunnel junction 201 to apply in-plane current to the magnetic tunnel junction 201. The fixed magnetic body 240 has a fixed magnetization direction and is a thin film including a material magnetized in a direction perpendicular to a film surface. The free magnetic body 120 has a structure of [auxiliary free magnetic layers 122a to 122n/free non-magnetic layers 124a to 124n]$_N$/main free magnetic layer 126, where N is a positive integer greater than or equal to 2 and indicates that an [auxiliary free magnetic layers 122a to 122n/free non-magnetic layers 124a to 124n] structure is stacked repeatedly N times. Each of the main free magnetic layer 126 and the auxiliary free magnetic layers 122a to 122n changes in magnetization direction and is a thin film magnetized in a direction perpendicular to a film surface. The main free magnetic body 120 is disposed adjacent to the conducting wire 110 that generates spin current due to the in-plane current. Among the free magnetic layers 122a to 122n and 126 constituting the free magnetic body 120, two magnetic layers closest to each other are magnetized in opposite directions by RKKY exchange interaction through the free magnetic layers 124a to 124n.

The fixed magnetic body 240 may have a synthetic antiferromagnetic structure including a first fixed magnetic layer 244, a fixed non-magnetic layer 246, and a second fixed magnetic layer 248 that are sequentially stacked. Each of the first fixed magnetic layer 244 and the second fixed magnetic layer 248 may independently include at least one of Fe, Co, Ni, B, Si, Zr, and a combination thereof. The fixed non-magnetic layer 246 may include at least one of Ru, Ta, Cu, and a combination thereof.

According to a modified embodiment of the present disclosure, the fixed magnetic body 240 may be an exchange-biased antiferromagnetic structure including an antiferromagnetic layer 242, a first fixed magnetic layer 244, a fixed non-magnetic layer 246, and a second fixed magnetic layer 248 that are sequentially stacked. The antiferromagnetic layer 242 may be formed of a material including at least one of Ir, Pt, Mn, and a combination thereof. Each of the first and second fixed magnetic layers 244 and 248 may be independently formed of a material including at least one of Fe, Co, Ni, B, Si, Zr, and a combination thereof. The fixed non-magnetic layer 246 may be formed of a material including at least one of Ru, Ta, Cu, and a combination thereof.

Figure 8:
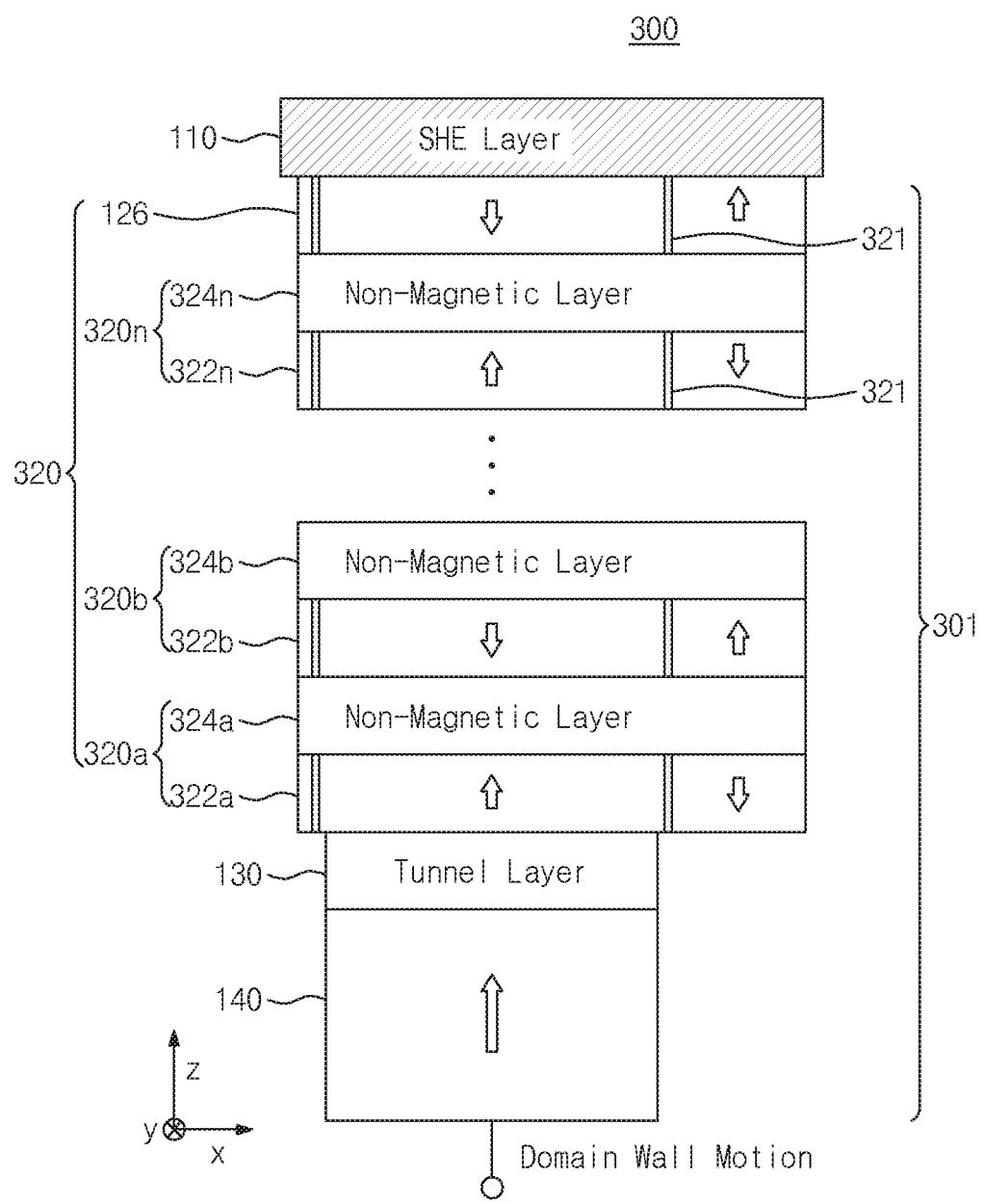

FIG. 8 illustrates a magnetic tunnel junction device according to another example embodiment of the present disclosure.

Referring to FIG. 8, a magnetic tunnel junction 300 includes a magnetic tunnel junction 301 including a fixed magnetic body 140, an insulator 130, and a free magnetic body 320 that are sequentially stacked and a conducting wire 110 disposed adjacent to the free magnetic body 320 of the magnetic tunnel junction 301 to apply in-plane current to the magnetic tunnel junction 301. The fixed magnetic body 140 has a fixed magnetization direction and is a thin film including a material magnetized in a direction perpendicular to a film surface. The free magnetic body 320 has a structure of [auxiliary free magnetic layers 322a to 322n/free non-magnetic layers 324a to 324n]$_N$/main free magnetic layer 326, where N is a positive integer greater than or equal to 2 and indicates that an [auxiliary free magnetic layers 322a to 322n/free non-magnetic layers 324a to 324n] structure (320a to 320n) is stacked repeatedly N times. Each of the main free magnetic layer 326 and the auxiliary free magnetic layers 322a to 322n changes in magnetization direction and is a thin film magnetized in a direction perpendicular to a film surface. The main free magnetic layer 326 is disposed adjacent to the conducting wire 110 that generates spin current due to the in-plane current. Among the free magnetic layers 322a to 322n and 326 constituting the free magnetic body 320, two magnetic layers closest to each other are magnetized in opposite directions by RKKY exchange interaction through the free magnetic layers 324a to 324n.

The fixed magnetic body 140 may not be aligned with the free magnetic body 320. Specifically, the fixed magnetic body 140 and the free magnetic body 320 may extend parallel to each other in an extending direction of the conducting wire 110. The free magnetic layer 320 may include at least one magnetic domain structure 321. Specifically, each of the main free magnetic layer 326 and the auxiliary free magnetic layers 322a to 322n may include at least one magnetic domain structure 321. The magnetic domain structure 321 may move in an x axis direction due to in-plane current flowing to the conducting wire 110. The magnetic domain structure 321 may be a magnetic domain wall or a skyrmion and may divide a magnetic domain in opposite directions.

Figure 9:
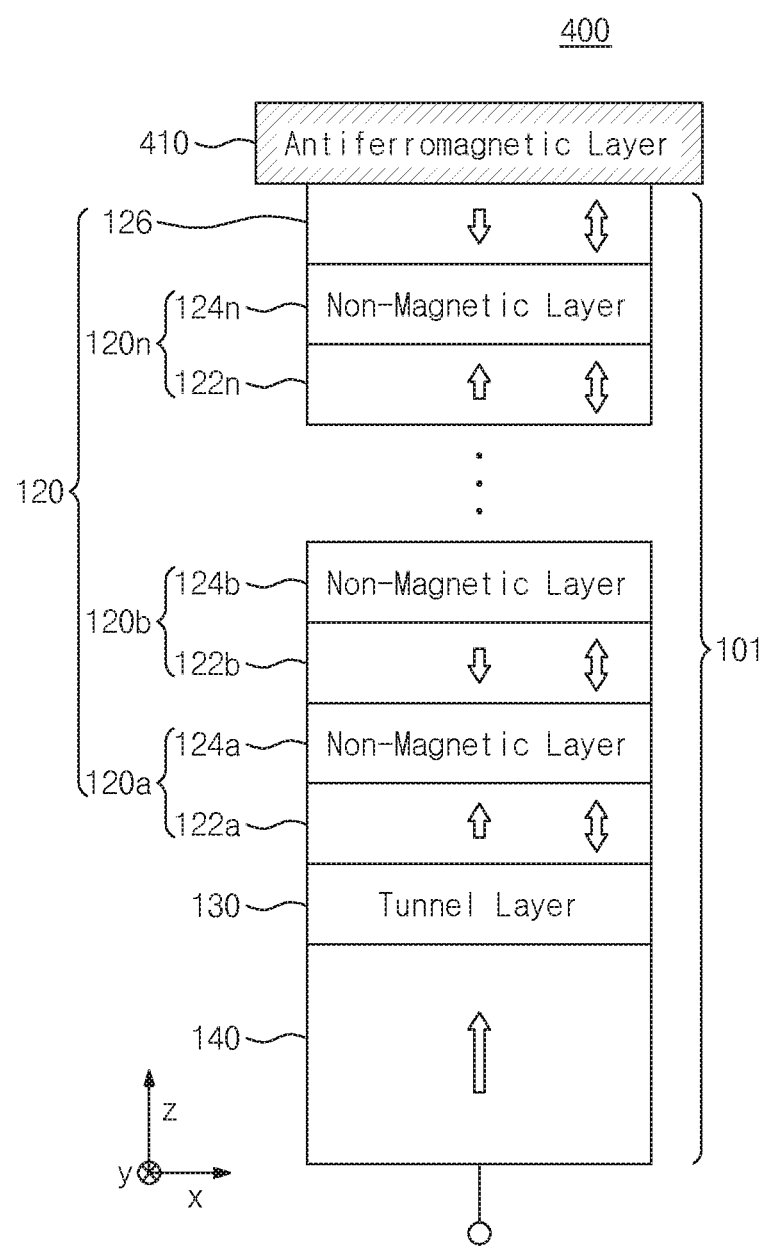

FIG. 9 illustrates a magnetic tunnel junction device according to another example embodiment of the present disclosure.

Referring to FIG. 9, a magnetic tunnel junction 400 includes a magnetic tunnel junction 101 including a fixed magnetic body 140, an insulator 130, and a free magnetic body 120 that are sequentially stacked and a conducting wire 410 disposed adjacent to the free magnetic body 120 of the magnetic tunnel junction 101 to apply in-plane current to the magnetic tunnel junction 101. The fixed magnetic body 140 has a fixed magnetization direction and is a thin film including a material magnetized in a direction perpendicular to a film surface. The free magnetic body 120 has a structure of [auxiliary free magnetic layers 122a to 122n/free non-magnetic layers 124a to 124n]$_N$/main free magnetic layer 126, where N is a positive integer greater than or equal to 2 and indicates that an [auxiliary free magnetic layers 122a to 122n/free non-magnetic layers 124a to 124n] structure (120a to 120n) is stacked repeatedly N times. Each of the main free magnetic layer 126 and the auxiliary free magnetic layers 122a to 122n changes in magnetization direction and is a thin film magnetized in a direction perpendicular to a film surface. The main free magnetic layer 126 is disposed adjacent to the conducting wire 410 that generates spin current due to the in-plane current. Among the free magnetic layers 122a to 122n and 126 constituting the free magnetic body 320, two magnetic layers closest to each other are magnetized in opposite directions by RKKY exchange interaction through the free magnetic layers 124a to 124n.

The conductor 410 may include a conductive antiferromagnetic body. Specifically, the conducting wire 410 may apply in-plane current and include an antiferromagnetic layer. The conducting wire 410 may provide an in-plane exchange bias magnetic field to the main free magnetic layer 126. Specifically, the conducting wire 410 may be FeMn, PtMn or IrMn. The antiferromagnetic layer may provide an exchange bias magnetic field to the free magnetic body 120. Thus, the magnetic tunnel junction device may switch a magnetization direction of a free magnetic body having perpendicular magnetic anisotropy without using an external magnetic field.

Figure 10:
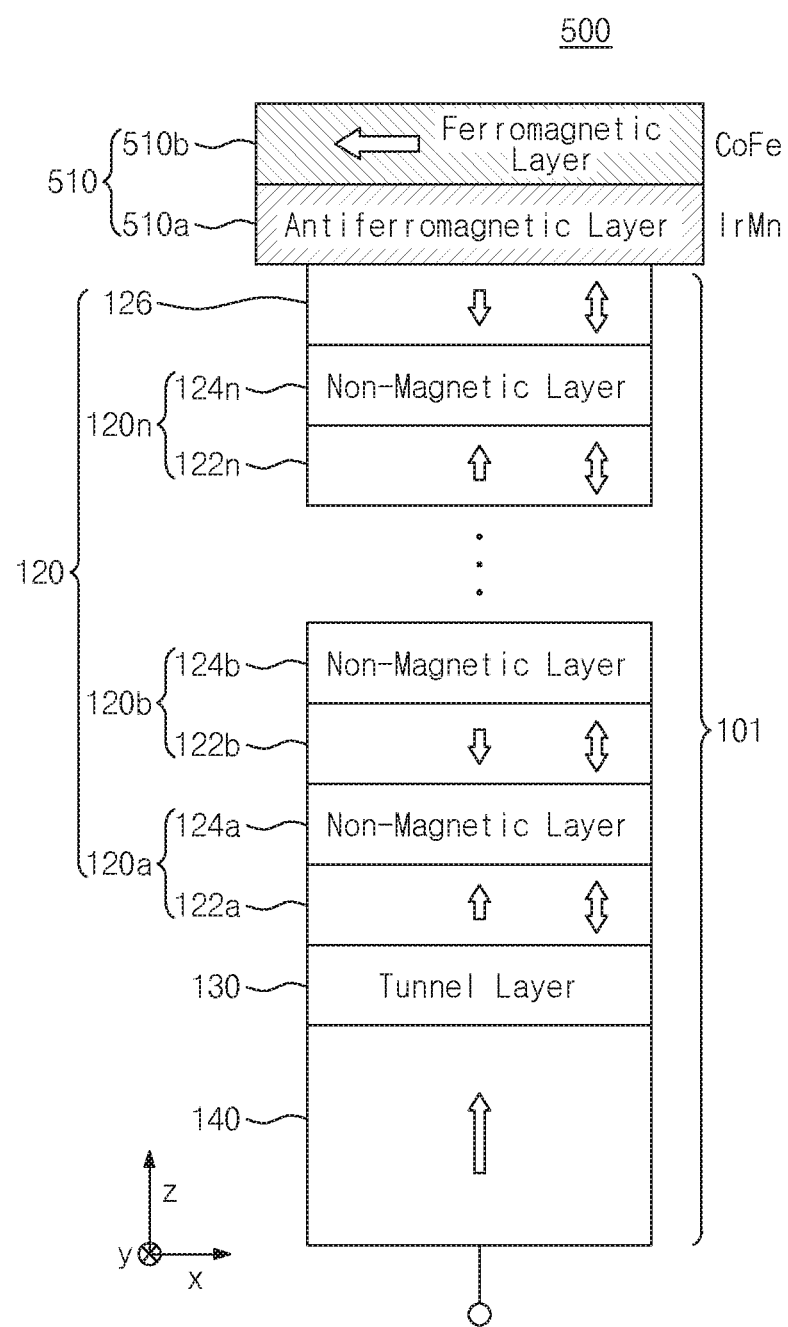

FIG. 10 illustrates a magnetic tunnel junction device according to another example embodiment of the present disclosure.

Referring to FIG. 10, a magnetic tunnel junction device 500 includes a magnetic tunnel junction 101 including a fixed magnetic body 140, an insulator 130, and a free magnetic body 120 that are sequentially stacked and a conducting wire 510 disposed adjacent to the free magnetic body 120 of the magnetic tunnel junction 101 to apply in-plane current to the magnetic tunnel junction 101. The fixed magnetic body 140 has a fixed magnetization direction and is a thin film including a material magnetized in a direction perpendicular to a film surface. The free magnetic body 120 has a structure of [auxiliary free magnetic layers 122a to 122n/free non-magnetic layers 124a to 124n]$_N$/main free magnetic layer 126, where N is a positive integer greater than or equal to 2 and indicates that an [auxiliary free magnetic layers 122a to 122n/free non-magnetic layers 124a to 124n] structure (120a to 120n) is stacked repeatedly N times. Each of the main free magnetic layer 126 and the auxiliary free magnetic layers 122a to 122n changes in magnetization direction and is a thin film magnetized in a direction perpendicular to a film surface. The main free magnetic layer 126 is disposed adjacent to the conducting wire 410 that generates spin current due to the in-plane current. Among the free magnetic layers 122a to 122n and 126 constituting the free magnetic body 320, two magnetic layers closest to each other are magnetized in opposite directions by RKKY exchange interaction through the free magnetic layers 124a to 124n.

The conducting wire 510 applying the in-plane current may include an antiferromagnetic layer 510a and a ferromagnetic layer 510b that are sequentially stacked. The antiferromagnetic layer 510a may be disposed adjacent to the main free magnetic layer 126. The ferromagnetic layer 510b may have an in-plane magnetization direction or a magnetization direction in which the ferromagnetic layer 510b extends. The conducting wire 510 may provide an in-plane exchange bias magnetic field to the main free magnetic layer 126. The free magnetic body 120 may be switched without using an external magnetic field.

The ferromagnetic layer 510b has in-plane magnetic anisotropy and provides a function to antiferromagnetically align the antiferromagnetic layer 510a in an in-plane direction. The antiferromagnetic layer 510a adjacent to the free magnetic body 120 having perpendicular magnetic anisotropy establishes an exchange bias magnetic field of a direction perpendicular to the free magnetic body 120 having the perpendicular magnetic anisotropy. Specifically, during thermal annealing under a horizontal magnetic field, the ferromagnetic layer 510b is antiferromagnetically aligned with the antiferromagnetic layer 510a in the in-plane direction by exchange interaction between the antiferromagnetic layer 510b having in-plane magnetic anisotropy and the antiferromagnetic layer 510a. Thus, an exchange bias magnetic field of a horizontal direction is induced to the free magnetic body 120 having perpendicular magnetic anisotropy adjacent to an opposite side by an antiferromagnetic rule. Current flowing to the conducting wire 510 including the antiferromagnetic layer 510a generates a spin-orbit spin torque through anomalous Hall effect or spin Hall effect.

Figure 11:
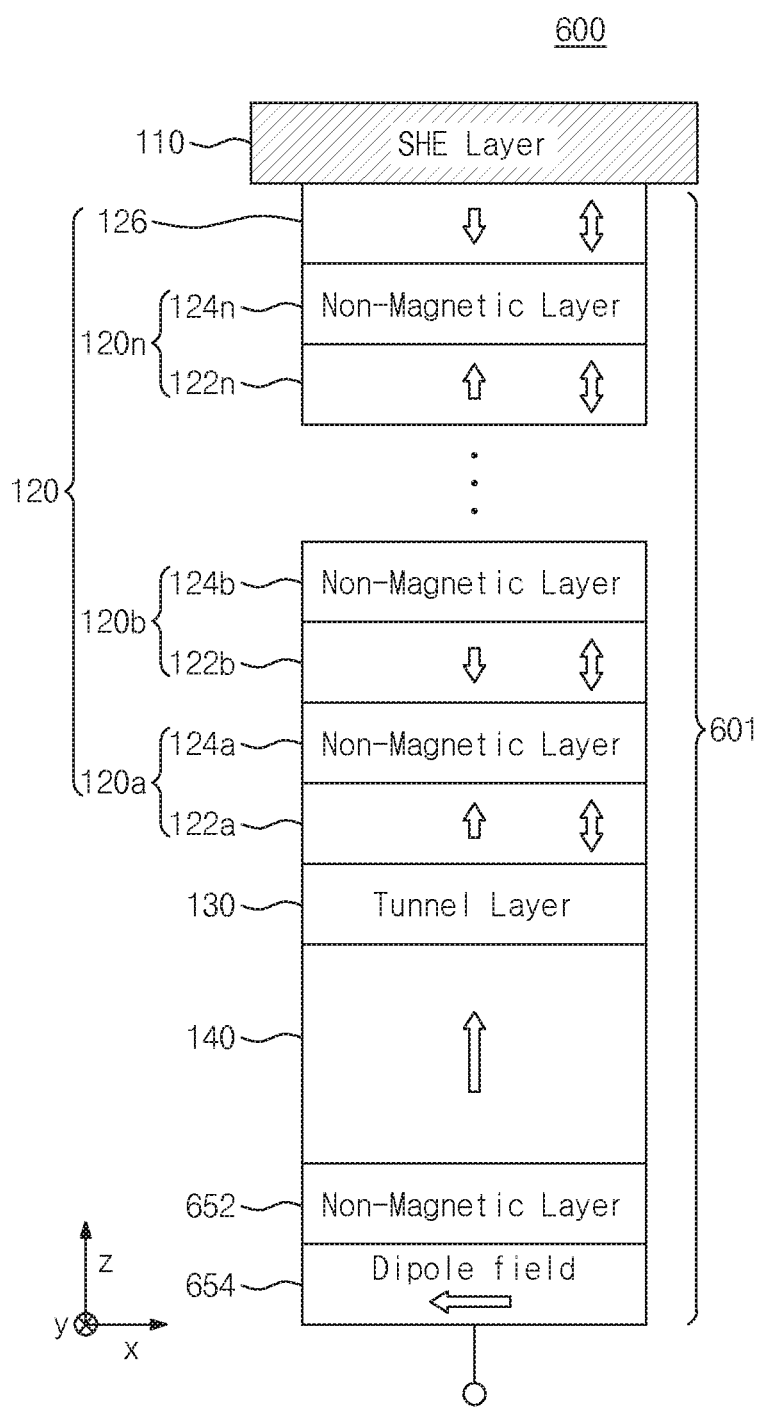

FIG. 11 illustrates a magnetic tunnel junction device according to another example embodiment of the present disclosure.

Referring to FIG. 11, a magnetic tunnel junction device 600 includes a magnetic tunnel junction 601 including a fixed magnetic body 140, an insulator 130, and a free magnetic body 120 that are sequentially stacked and a conducting wire 110 disposed adjacent to the free magnetic body 120 of the magnetic tunnel junction 101 to apply in-plane current to the magnetic tunnel junction 101. The fixed magnetic body 140 has a fixed magnetization direction and is a thin film including a material magnetized in a direction perpendicular to a film surface. The free magnetic body 120 has a structure of [auxiliary free magnetic layers 122a to 122n/free non-magnetic layers 124a to 124n]$_N$/main free magnetic layer 126, where N is a positive integer greater than or equal to 2 and indicates that an [auxiliary free magnetic layers 122a to 122n/free non-magnetic layers 124a to 124n] structure (120a to 120n) is stacked repeatedly N times. Each of the main free magnetic layer 126 and the auxiliary free magnetic layers 122a to 122n changes in magnetization direction and is a thin film magnetized in a direction perpendicular to a film surface. The main free magnetic layer 126 is disposed adjacent to the conducting wire 110 that generates spin current due to the in-plane current. Among the free magnetic layers 122a to 122n and 126 constituting the free magnetic body 320, two magnetic layers closest to each other are magnetized in opposite directions by RKKY exchange interaction through the free magnetic layers 124a to 124n.

A dipole filed non-magnetic layer 652 and a dipole field ferromagnetic layer 654 having an in-plane magnetization direction are sequentially stacked adjacent to the fixed magnetic body 140. The dipole field non-magnetic layer 652 is disposed adjacent to the fixed magnetic body 140.

The dipole field non-magnetic layer 652 may be a conductive metal layer including at least one of Ru, Ta, Cu, and a combination thereof.

The dipole field ferromagnetic layer 654 may have an in-plane magnetization direction (e.g., −x axis direction) and may establish a dipole magnetic field a dipole magnetic field to establish a magnetic field at the free magnetic body 120 in an in-plane direction (+x axis direction). Thus, the free magnetic body 120 of the magnetic tunnel junction device 600 may perform magnetization reversal without using an external magnetic field.

Figure 12:
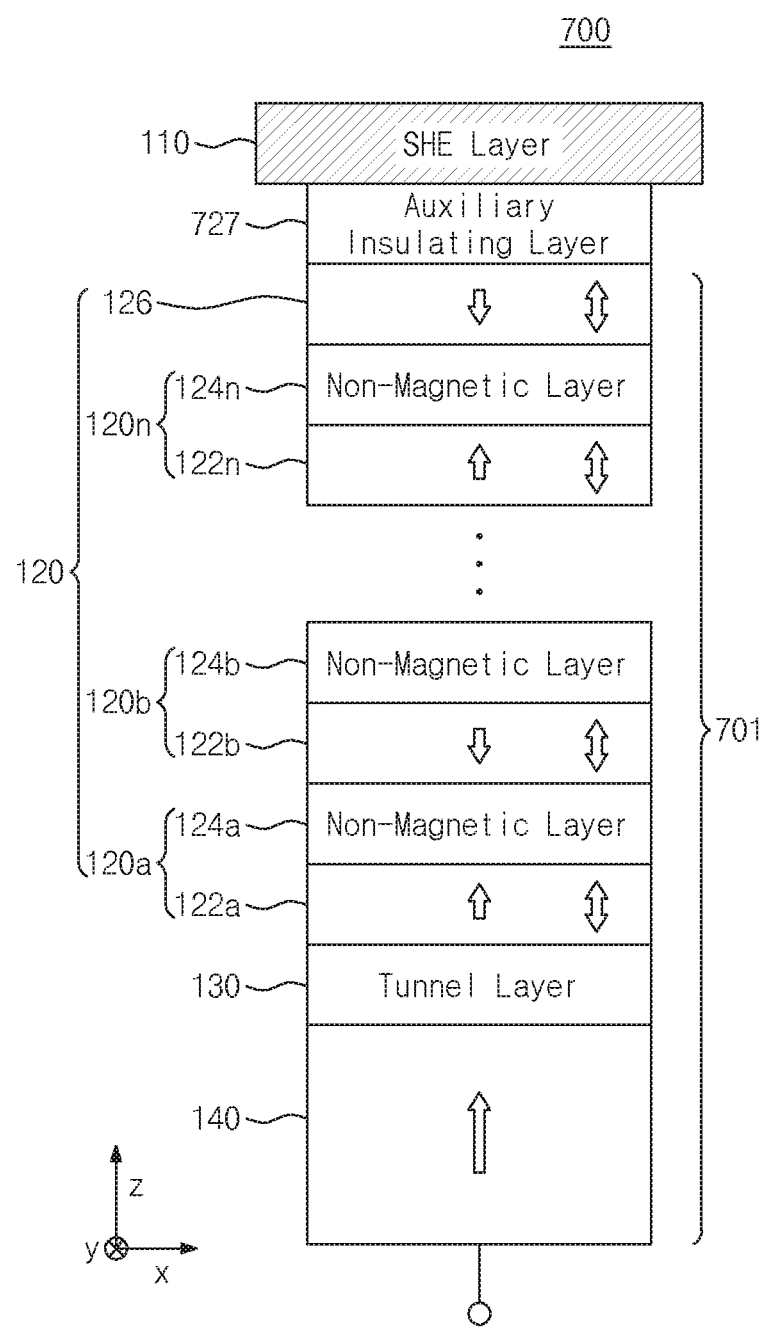

FIG. 12 illustrates a magnetic tunnel junction device according to another example embodiment of the present disclosure.

Referring to FIG. 12, a magnetic tunnel junction device 700 includes a magnetic tunnel junction 701 including a fixed magnetic body 140, an insulator 130, and a free magnetic body 120 that are sequentially stacked and a conducting wire 110 disposed adjacent to the free magnetic body 120 of the magnetic tunnel junction 701 to apply in-plane current to the magnetic tunnel junction 701. The fixed magnetic body 140 has a fixed magnetization direction and is a thin film including a material magnetized in a direction perpendicular to a film surface. The free magnetic body 120 has a structure of [auxiliary free magnetic layers 122a to 122n/free non-magnetic layers 124a to 124n]$_N$/main free magnetic layer 126, where N is a positive integer greater than or equal to 2 and indicates that an [auxiliary free magnetic layers 122a to 122n/free non-magnetic layers 124a to 124n] structure (120a to 120n) is stacked repeatedly N times. Each of the main free magnetic layer 126 and the auxiliary free magnetic layers 122a to 122n changes in magnetization direction and is a thin film magnetized in a direction perpendicular to a film surface. The main free magnetic layer 126 is disposed adjacent to the conducting wire 110 that generates spin current due to the in-plane current. Among the free magnetic layers 122a to 122n and 126 constituting the free magnetic body 320, two magnetic layers closest to each other are magnetized in opposite directions by RKKY exchange interaction through the free magnetic layers 124a to 124n.

An auxiliary insulating layer 727 is disposed between the conducting wire 110 and the free magnetic body 120. The auxiliary insulating layer 727 may include at least one of $AlO_x$, MgO, $TaO_x$, $ZrO_x$, and a combination thereof. The auxiliary insulating layer may prevent in-plane charge current flowing along the conducting wire 110 from directly flowing through the magnetic tunnel junction 701 and allows only sure spin current to pass therethrough.

Figure 13:
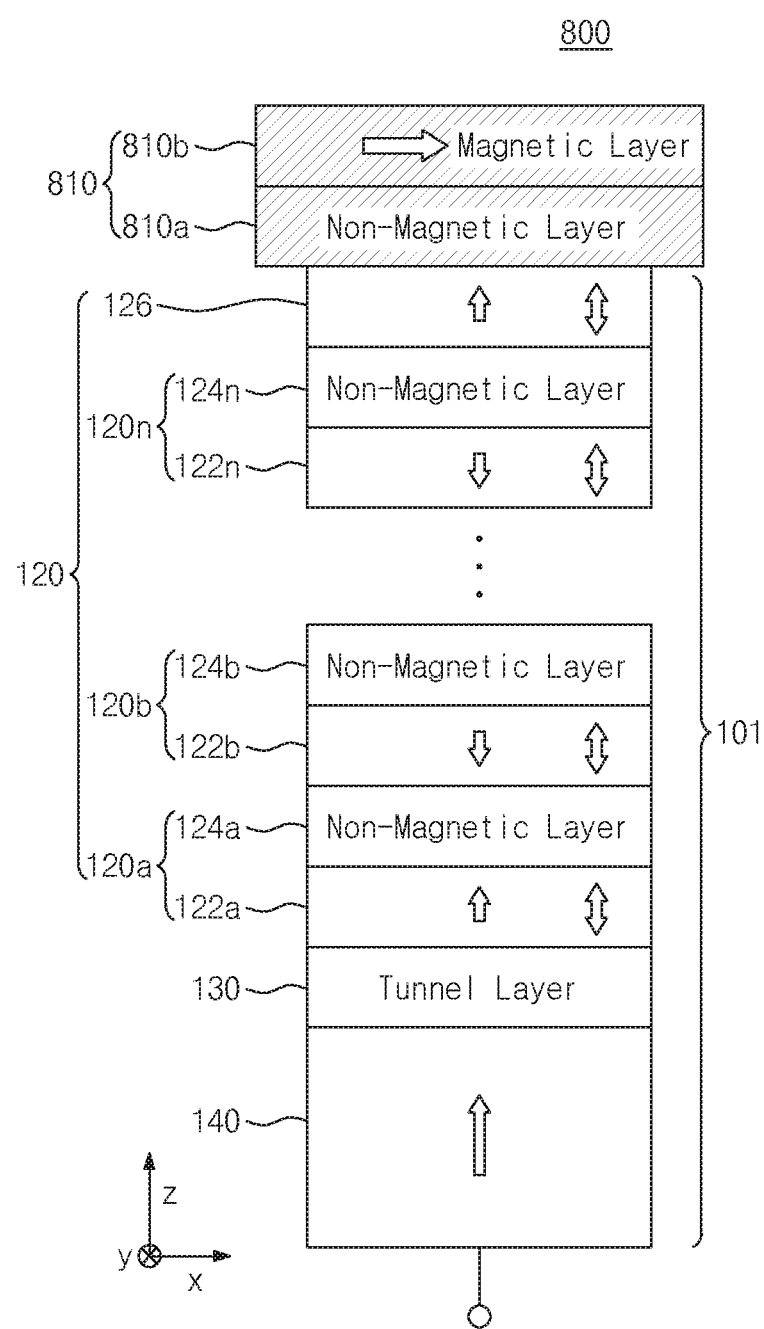

FIG. 13 illustrates a magnetic tunnel junction device according to another example embodiment of the present disclosure.

Referring to FIG. 13, a magnetic tunnel junction device 800 includes a magnetic tunnel junction 101 including a fixed magnetic body 140, an insulator 130, and a free magnetic body 120 that are sequentially stacked and a conducting wire 810 disposed adjacent to the free magnetic body 120 of the magnetic tunnel junction 101 to apply in-plane current to the magnetic tunnel junction 101. The fixed magnetic body 140 has a fixed magnetization direction and is a thin film including a material magnetized in a direction perpendicular to a film surface. The free magnetic body 120 has a structure of [auxiliary free magnetic layers 122a to 122n/free non-magnetic layers 124a to 124n]$_N$/main free magnetic layer 126, where N is a positive integer greater than or equal to 2 and indicates that an [auxiliary free magnetic layers 122a to 122n/free non-magnetic layers 124a to 124n] structure (120a to 120n) is stacked repeatedly N times. Each of the main free magnetic layer 126 and the auxiliary free magnetic layers 122a to 122n changes in magnetization direction and is a thin film magnetized in a direction perpendicular to a film surface. The main free magnetic layer 126 is disposed adjacent to the conducting wire 810 that generates spin current due to the in-plane current. Among the free magnetic layers 122a to 122n and 126 constituting the free magnetic body 320, two magnetic layers closest to each other are magnetized in opposite directions by RKKY exchange interaction through the free magnetic layers 124a to 124n.

The conducting wire 810 may include a conducting wire non-magnetic layer 810a and a conducting wire ferromagnetic layer 810b that are sequentially stacked. The conducting wire ferromagnetic layer 810b may include an in-plane magnetization direction component. The conducting wire non-magnetic layer 810a may be disposed adjacent to the free magnetic body 120. The conducting wire non-magnetic layer 810a may include one material selected from Cu, Ta, Pt, W, Bi, Ir, Mn, Ti, Cr, and a combination thereof. The conducting wire ferromagnetic layer 810b may include at least one of Fe, Co, Ni, B, Si, Zr, and a combination thereof. Spin current may be generated through anomalous Hall effect or anisotropic magnetoresistance effect of the conducting wire ferromagnetic layer 810b by the in-plane charge current flowing through the conducting wire ferromagnetic layer 810b [T. Taniguchi, J. Grollier, M. D. Stiles, Physical Review Applied 3, 044001 (2015)]. Alternatively, the spin current may be generated by effect of interface spin-orbit coupling [V. P. Amin, M. D. Stiles, Physical Review B 94, 104419 (2016)].

Figure 14:
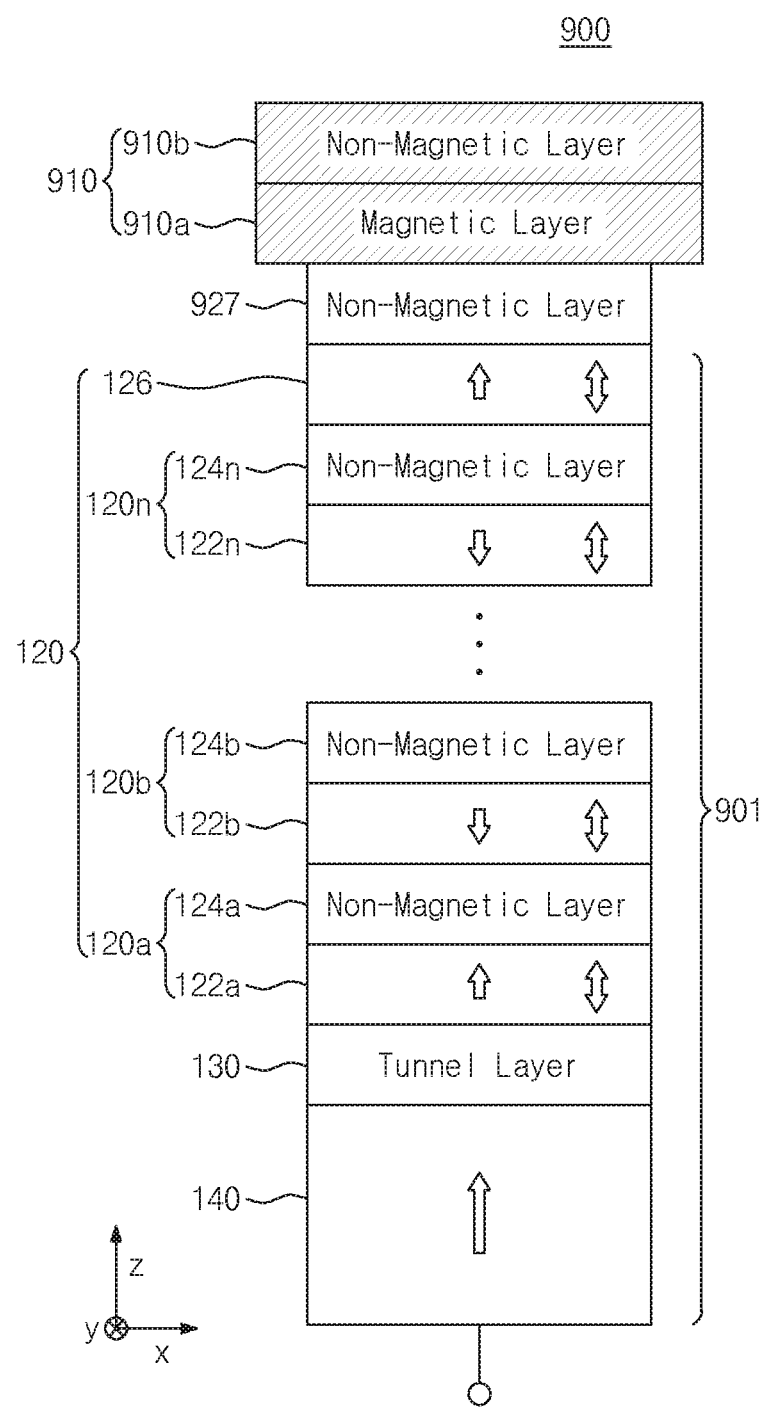

FIG. 14 illustrates a magnetic tunnel junction device according to another example embodiment of the present disclosure.

Referring to FIG. 14, a magnetic tunnel junction device 900 includes a magnetic tunnel junction 901 including a fixed magnetic body 140, an insulator 130, and a free magnetic body 120 that are sequentially stacked and a conducting wire 910 disposed adjacent to the free magnetic body 120 of the magnetic tunnel junction 101 to apply in-plane current to the magnetic tunnel junction 901. The fixed magnetic body 140 has a fixed magnetization direction and is a thin film including a material magnetized in a direction perpendicular to a film surface. The free magnetic body 120 has a structure of [auxiliary free magnetic layers 122a to 122n/free non-magnetic layers 124a to 124n]$_N$/main free magnetic layer 126, where N is a positive integer greater than or equal to 2 and indicates that an [auxiliary free magnetic layers 122a to 122n/free non-magnetic layers 124a to 124n] structure (120a to 120n) is stacked repeatedly N times. Each of the main free magnetic layer 126 and the auxiliary free magnetic layers 122a to 122n changes in magnetization direction and is a thin film magnetized in a direction perpendicular to a film surface. The main free magnetic layer 126 is disposed adjacent to the conducting wire 910 that generates spin current due to the in-plane current. Among the free magnetic layers 122a to 122n and 126 constituting the free magnetic body 320, two magnetic layers closest to each other are magnetized in opposite directions by RKKY exchange interaction through the free magnetic layers 124a to 124n.

The conducting wire 910 may include a conducting wire non-magnetic layer 910a and a conducting wire ferromagnetic layer 910b that are sequentially stacked. A non-magnetic layer 927 may be provided between the conductive ferromagnetic layer 910a and the free magnetic body 120. The conducting wire ferromagnetic layer 910a may be disposed adjacent to the free magnetic body 120. The non-magnetic layer 927 may be aligned with a side surface of the free magnetic body 120.

The conducting wire non-magnetic layer 910b and the non-magnetic layer 927 may include one material selected from Cu, Ta, Pt, W, Bi, Ir, Mn, Ti, Cr, and a combination thereof. The conducting wire ferromagnetic layer 910a may include at least one of Fe, Co, Ni, B, Si, Zr, and a combination thereof.

Figure 15:
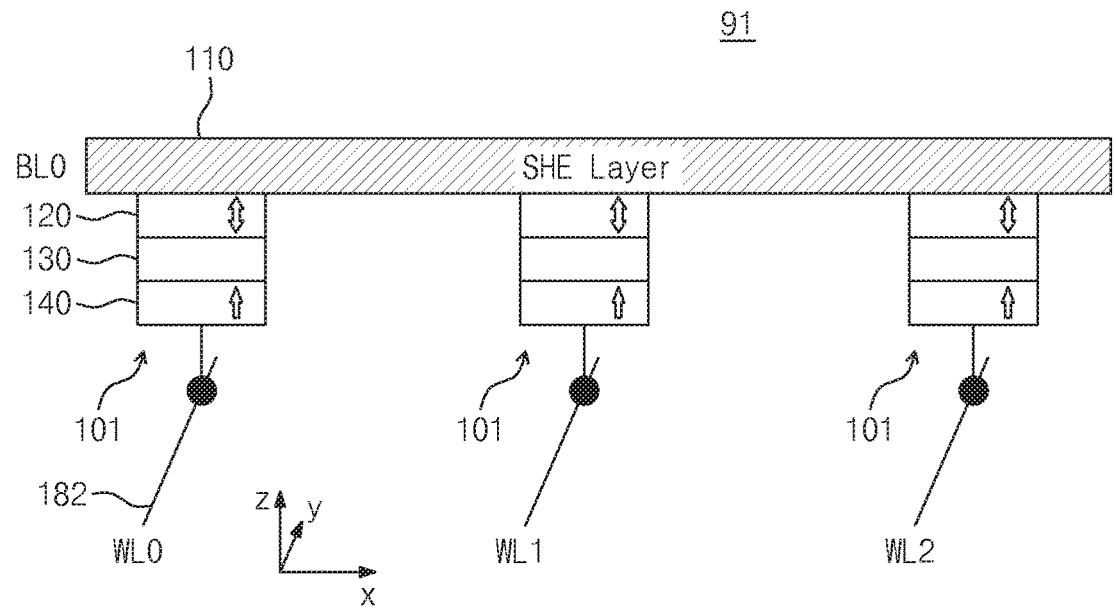
FIGS. 15 through 22 illustrate a driving method and a disposition of a magnetic memory device according to example embodiments of the present disclosure.

FIG. 15 illustrates a magnetic memory device according to an example embodiment of the present disclosure.

Referring to FIG. 15, a magnetic memory device 91 includes a plurality of magnetic tunnel junctions 101. The magnetic tunnel junction 101 or a magnetic tunnel junction 100 may be variously modified as described with reference to FIGS. 2 to 14.

The magnetic memory device 91 includes a plurality of magnetic tunnel junctions 101 arranged on a substrate placement plane in a matrix format and a first conductive pattern 110 disposed adjacent to a free magnetic body 120 of the magnetic tunnel junction 101. A fixed magnetic body 140 has a fixed magnetization direction and is a thin film formed of a material magnetized in a direction perpendicular to a film surface. The free magnetic body 120 changes in a magnetization direction and is a thin film formed of a material magnetized in a direction perpendicular to a film surface. The free magnetic body 120 has a structure of [auxiliary free magnetic layer/free non-magnetic layer]$_N$/main free magnetic layer, where N is a positive integer greater than or equal to 2 and indicates that an [auxiliary free magnetic layer/free non-magnetic layer] structure is stacked repeatedly N times. Among the free magnetic layers 122a to 122n and 126 constituting the free magnetic body 120, two magnetic layers closest to each other are magnetized in opposite directions by RKKY exchange interaction through free magnetic layers 124a to 124n. The magnetic tunnel junction 101 may include a fixed magnetic body, an insulator, and a free magnetic body that are sequentially stacked.

The main free magnetic layer 126 may be disposed adjacent to the first conductive pattern 110, and the first conductive pattern 110 may generate spin current from in-plane current to switch a magnetization direction of the free magnetic body 120.

The total thickness of the free magnetic body 120 is 2 nm or more to secure high thermal stability.

N is a positive integer greater than or equal to 2, and adjacent auxiliary free magnetic layers may have magnetizations of opposite directions in the free magnetic body 120 by Ruderman-Kittel-Kasuya-Yosida (RKKY) exchange interaction. The entire thickness of the free magnetic body 120 may be 2 nm or more. The auxiliary free magnetic layer and the main free magnetic layer may be formed of different materials or may have different thicknesses, respectively.

Each of the auxiliary free magnetic layer and the main free magnetic layer may have a thickness of about 0.3 nm.

The first conductive pattern 110 may be formed of one material selected from Cu, Ta, Pt, W, Bi, Ir, Mn, Ti, Cr, and a combination thereof. The first conductive pattern 110 may provide spin current to the free magnetic layer and may apply a spin-orbit spin torque to the free magnetic body 120. The spin-orbit spin torque may contribute to magnetization reversal of the free magnetic body 120.

The first conductive patterns 110 or BL may run parallel on a substrate plane in a first direction. A free magnetic body 120 of each of the magnetic tunnel junctions arranged in the first direction may be periodically arranged adjacent to the first conductive pattern 110. A second conductive pattern 182 or WL may be electrically connected to a fixed magnetic body 140 of each of the magnetic tunnel junctions 101 arranged in a second direction perpendicular to the first direction and may extend on the substrate plane in the second direction.

The magnetic memory device 91 may operate as a cross-point memory. The magnetic memory device 91 may operate due to spin Hall effect generated by current flowing to the first conductive pattern 110 and critical current damping effect generated by a voltage applied to the second conductive pattern 182. Alternatively, the magnetic memory device 91 may operate due to spin Hall effect generated by current flowing to the first conductive pattern 110 and spin-transfer torque effect generated by current flowing through a selected magnetic tunnel junction.

Figure 16:
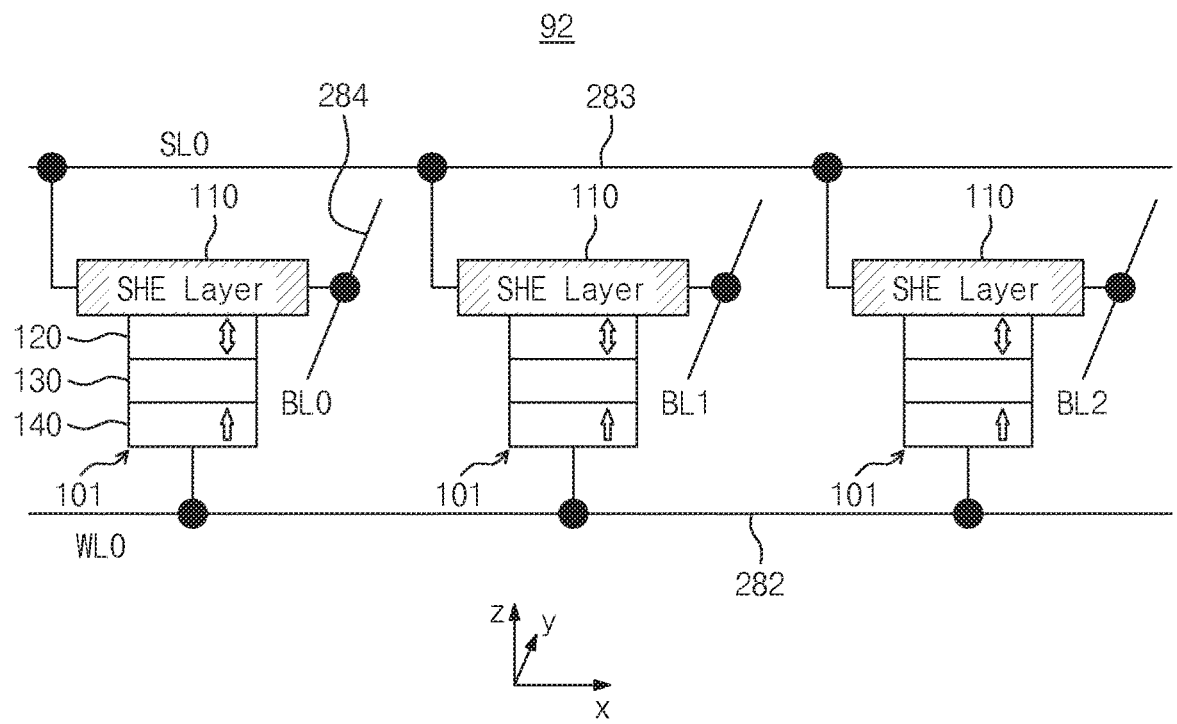

FIG. 16 illustrates a magnetic memory device according to another example embodiment of the present disclosure.

Referring to FIG. 16, a magnetic memory device 92 includes a plurality of magnetic tunnel junctions. The magnetic memory device 92 includes a plurality of magnetic tunnel junctions 101 arranged on a substrate placement plane in a matrix format and a first conductive pattern 110 disposed adjacent to a free magnetic body 120 of the magnetic tunnel junction 101. A fixed magnetic body 140 has a fixed magnetization direction and is a thin film formed of a material magnetized in a direction perpendicular to a film surface. The free magnetic body 120 changes in a magnetization direction and is a thin film formed of a material magnetized in a direction perpendicular to a film surface. The free magnetic body 120 has a structure of [auxiliary free magnetic layer/free non-magnetic layer]$_N$/ main free magnetic layer, where N is a positive integer greater than or equal to 2 and indicates that an [auxiliary free magnetic layer/free non-magnetic layer] structure is stacked repeatedly N times. Among the free magnetic layers 122a to 122n and 126 constituting the free magnetic body 120, two magnetic layers closest to each other are magnetized in opposite directions by RKKY exchange interaction through free magnetic layers 124a to 124n. The magnetic tunnel junction 101 may include a fixed magnetic body, an insulator, and a free magnetic body that are sequentially stacked.

The first conductive pattern 110 may be periodically disposed to be spaced apart from a substrate plane in a first direction. A free magnetic body 120 of each of the magnetic tunnel junctions arranged in the first direction may be periodically disposed adjacent to the first conductive pattern 110. The first conductive pattern 110 may provide spin current to the free magnetic layer and may apply a spin-orbit spin torque to the free magnetic body 120. The spin-orbit spin torque may contribute to magnetization reversal of the free magnetic body 120.

A second conductive pattern 282 or WL is electrically connected to a fixed magnetic body 140 of each of the magnetic tunnel junctions arranged in the first direction and extends on the substrate plane in the first direction.

A third conductive pattern 283 or SL is connected to one end of each of the first conductive patterns 110 arranged in the first direction and extends in the first direction.

A fourth conductive pattern 284 or BL is connected to the other end of each of the first conductive patterns 110 arranged in the second direction and extends in the second direction.

The magnetic memory device 92 may operate as a modified cross-point memory. The first conductive pattern 110 may be divided to inject spin current to the free magnetic body 120. When current flows through the third conductive pattern 283, the first conductive pattern 110, and the fourth conductive pattern 284, in-plane current flowing to the first conductive pattern 110 may contribute to magnetization reversal of the free magnetic body 120 by injecting the spin current into the free magnetic body 120.

Figure 17:
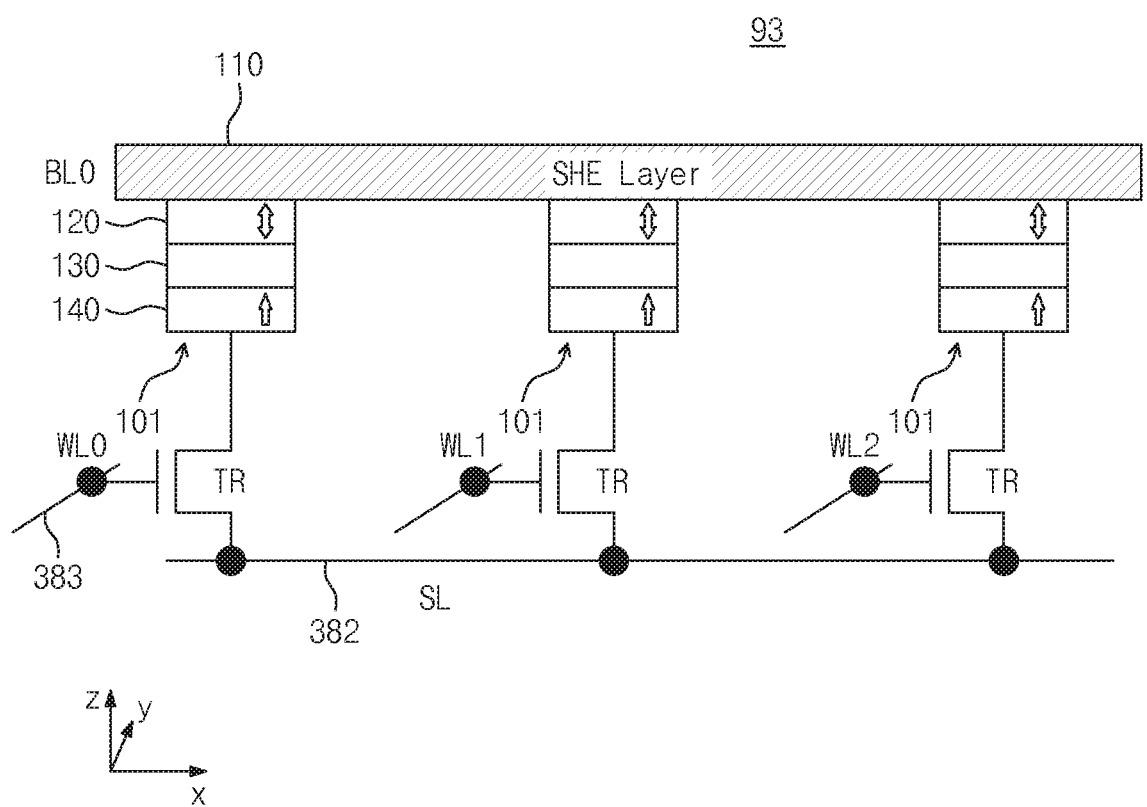

FIG. 17 illustrates a magnetic memory device according to another example embodiment of the present disclosure.

Referring to FIG. 17, a magnetic memory device 93 includes a plurality of magnetic tunnel junctions. The magnetic memory device 93 includes a plurality of magnetic tunnel junctions 101 arranged in a matrix format and a first conductive pattern 110 disposed adjacent to a free magnetic body 120 of the magnetic tunnel junction 101. A fixed magnetic body 140 has a fixed magnetization direction and is a thin film formed of a material magnetized in a direction perpendicular to a film surface. The free magnetic body 120 changes in a magnetization direction and is a thin film formed of a material magnetized in a direction perpendicular to a film surface. The free magnetic body 120 has a structure of [auxiliary free magnetic layer/free non-magnetic layer]$_N$/ main free magnetic layer, where N is a positive integer greater than or equal to 2 and indicates that an [auxiliary free magnetic layer/free non-magnetic layer] structure is stacked repeatedly N times. Among the free magnetic layers 122a to 122n and 126 constituting the free magnetic body 120, two magnetic layers closest to each other are magnetized in opposite directions by RKKY exchange interaction through free magnetic layers 124a to 124n. The magnetic tunnel junction 101 may include a fixed magnetic body, an insulator, and a free magnetic body that are sequentially stacked.

The first conductive pattern 110 may extend on a substrate plane in a first direction, and a free magnetic body 120 of each of the magnetic tunnel junctions arranged in the first direction may be periodically disposed adjacent to the first conductive pattern 110 or BL. The first conductive pattern 110 may provide spin current to the free magnetic layer and may apply spin-orbit spin torque to the free magnetic body 120. The spin-orbit spin torque may contribute to magnetization reversal of the free magnetic body 120.

Selection transistors TR may be electrically connected to fixed magnetic bodies 140 of the magnetic tunnel junctions 101, respectively.

A second conductive pattern 382 or SL may be electrically connected to a source/drain of each of the selection transistors arranged in the first direction and may extend on the substrate plane in the first direction.

A third conductive pattern 383 or WL may be connected to a gate of each of selection transistors arranged in a second direction perpendicular to the first direction.

When current flows to a specific first conductive pattern 110 (BL0), free magnetic layers of all magnetic tunnel junctions connected to the first conductive pattern 110 may receive spin current. On the other hand, a voltage is applied to a specific third conductive pattern connected to a gate of the selection transistor TR to select a specific memory cell. Accordingly, a specific memory cell may receive spin current generated by the first conductive pattern and may receive a voltage or spin-transfer current generated by a fixed magnetic layer due to the selected selection transistor. As a result, the specific memory cell may perform a write operation.

Figure 18:
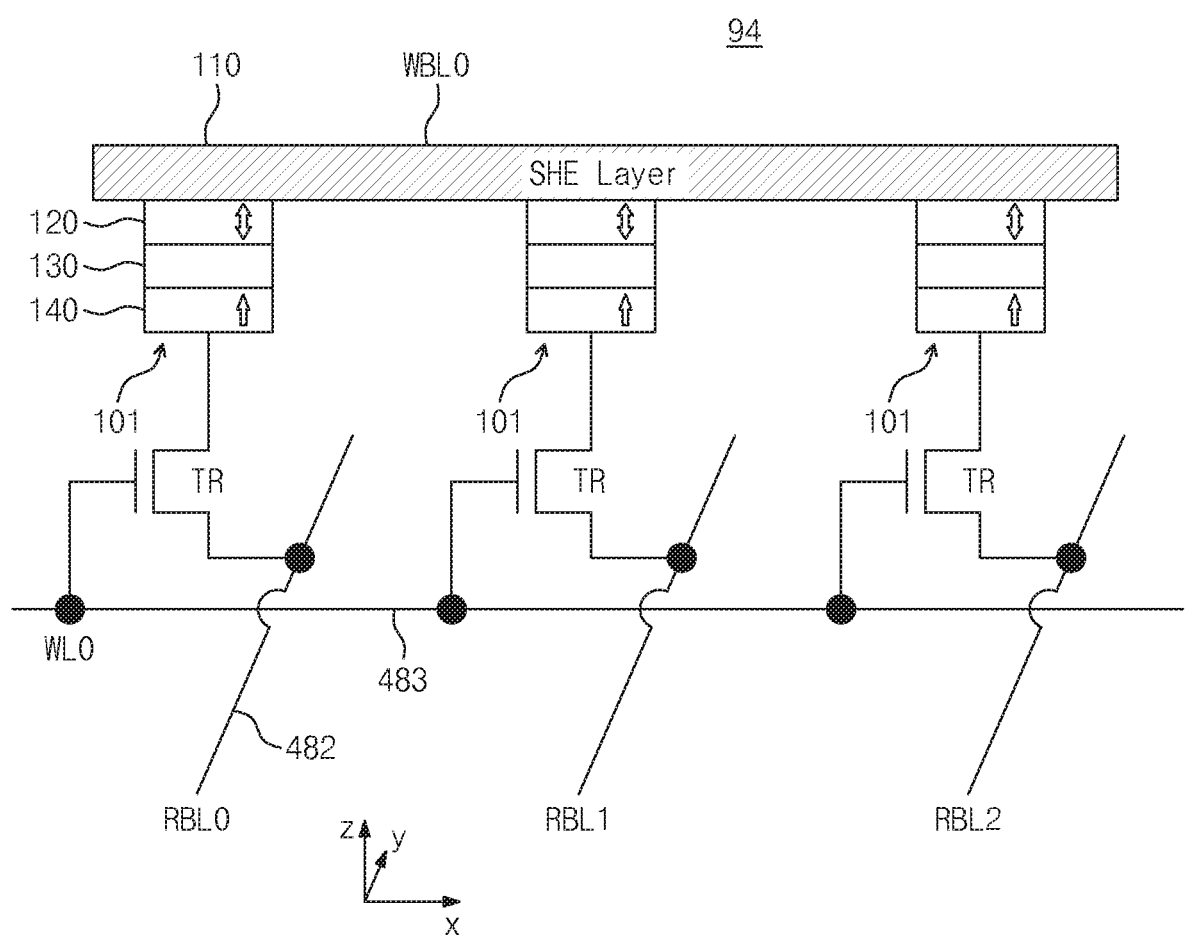

FIG. 18 illustrates a magnetic memory device according to another example embodiment of the present disclosure.

Referring to FIG. 18, a magnetic memory device 94 includes a plurality of magnetic tunnel junctions. The magnetic memory device 94 includes a plurality of magnetic tunnel junctions 101 arranged in a matrix format and a first conductive pattern 110 disposed adjacent to a free magnetic body 120 of the magnetic tunnel junction 101. A fixed magnetic body 140 has a fixed magnetization direction and is a thin film formed of a material magnetized in a direction perpendicular to a film surface. The free magnetic body 120 changes in a magnetization direction and is a thin film formed of a material magnetized in a direction perpendicular to a film surface. The free magnetic body 120 has a structure of [auxiliary free magnetic layer/free non-magnetic layer]$_N$/main free magnetic layer, where N is a positive integer greater than or equal to 2 and indicates that an [auxiliary free magnetic layer/free non-magnetic layer] structure is stacked repeatedly N times. Among the free magnetic layers 122a to 122n and 126 constituting the free magnetic body 120, two magnetic layers closest to each other are magnetized in opposite directions by RKKY exchange interaction through free magnetic layers 124a to 124n. The magnetic tunnel junction 101 may include a fixed magnetic body, an insulator, and a free magnetic body that are sequentially stacked.

The first conductive pattern 110 or WBL may extend on a substrate plane in a first direction, and a free magnetic body 120 of each of the magnetic tunnel junctions arranged in the first direction may be periodically disposed adjacent to the first conductive pattern 110. The first conductive pattern 110 may provide spin current to the free magnetic layer and may apply a spin-orbit spin torque to the free magnetic body 120. The spin-orbit spin torque may contribute to magnetization reversal of the free magnetic body 120.

Selection transistors TR may be electrically connected to fixed magnetic bodies 140 of the magnetic tunnel junctions 101, respectively.

A second conductive pattern 482 or RBL may be electrically connected to a source/drain of each of selection transistors TR arranged in a second direction perpendicular to the first direction and may extend on the substrate plane in the second direction.

A third conductive pattern 483 or WL may be connected to a gate of each of the selection transistor arranged in the first direction.

To perform a write operation on a specific memory cell, a specific first conductive pattern is selected and current flows to the selected first conductive pattern. In addition, a third conductive pattern connected to a gate of a selection transistor connected to the selected memory cell is selected, so a voltage is applied to the fixed magnetic layer or spin-transfer current flows to the fixed magnetic layer. As a result, the specific memory cell may perform a write operation.

Figure 19:
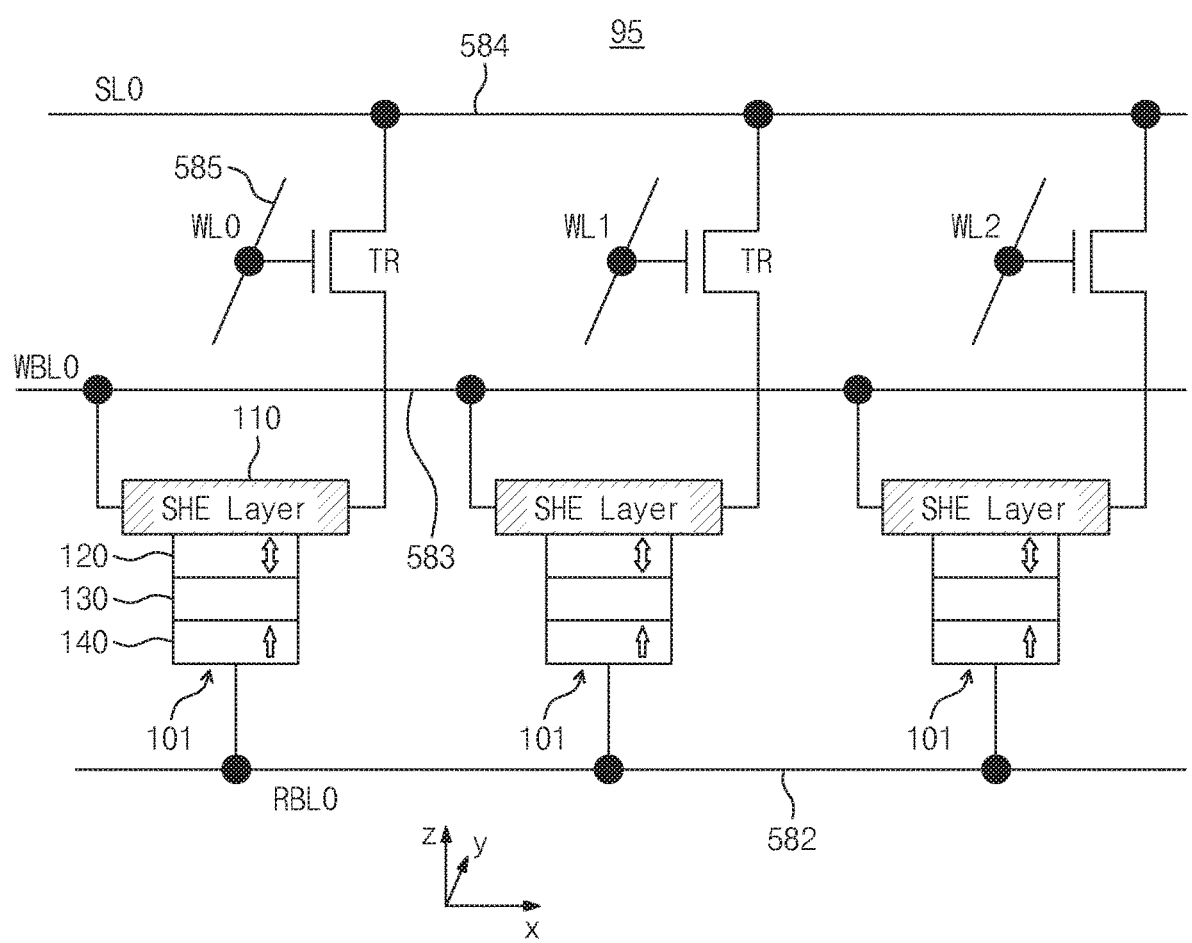

FIG. 19 illustrates a magnetic memory device according to another example embodiment of the present disclosure.

Referring to FIG. 19, a magnetic memory device 95 includes a plurality of magnetic tunnel junctions. The magnetic memory device 95 includes a plurality of magnetic tunnel junctions 101 arranged in a matrix format and a first conductive pattern 110 disposed adjacent to a free magnetic body 120 of the magnetic tunnel junction 101. A fixed magnetic body 140 has a fixed magnetization direction and is a thin film formed of a material magnetized in a direction perpendicular to a film surface. The free magnetic body 120 changes in a magnetization direction and is a thin film formed of a material magnetized in a direction perpendicular to a film surface. The free magnetic body 120 has a structure of [auxiliary free magnetic layer/free non-magnetic layer]$_N$/main free magnetic layer, where N is a positive integer greater than or equal to 2 and indicates that an [auxiliary free magnetic layer/free non-magnetic layer] structure is stacked repeatedly N times. Among the free magnetic layers 122a to 122n and 126 constituting the free magnetic body 120, two magnetic layers closest to each other are magnetized in opposite directions by RKKY exchange interaction through free magnetic layers 124a to 124n. The magnetic tunnel junction 101 may include a fixed magnetic body 140, an insulator 130, and a free magnetic body 120 that are sequentially stacked.

The first conductive pattern 110 or WBL may extend on a substrate plane in a first direction, and a free magnetic body 120 of each of the magnetic tunnel junctions arranged in the first direction may be periodically disposed adjacent to the first conductive pattern 110. The first conductive pattern 110 may provide spin current to the free magnetic layer and may apply a spin-orbit spin torque to the free magnetic body 120. The spin-orbit spin torque may contribute to magnetization reversal of the free magnetic body 120.

A second conductive pattern 582 or RBL may be electrically connected to a fixed magnetic body 140 of each of the magnetic tunnel junctions arranged in the first direction and may extend in the first direction.

A third conductive pattern 583 or WBL may be connected to one end of each of the first conductive patterns 110 arranged in the first direction and may extend in the first direction.

Selection transistors may be connected to the other ends of the first conductive patterns 110, respectively.

A fourth conductive pattern 584 or SL may be connected to a source/drain of each of the selection transistors TR arranged in the first direction and may extend in the first direction.

A fifth conductive pattern 585 or WL may be connected to a gate of each of selection transistors arranged in a second direction perpendicular to the first direction and may extend in the second direction.

Figure 20:
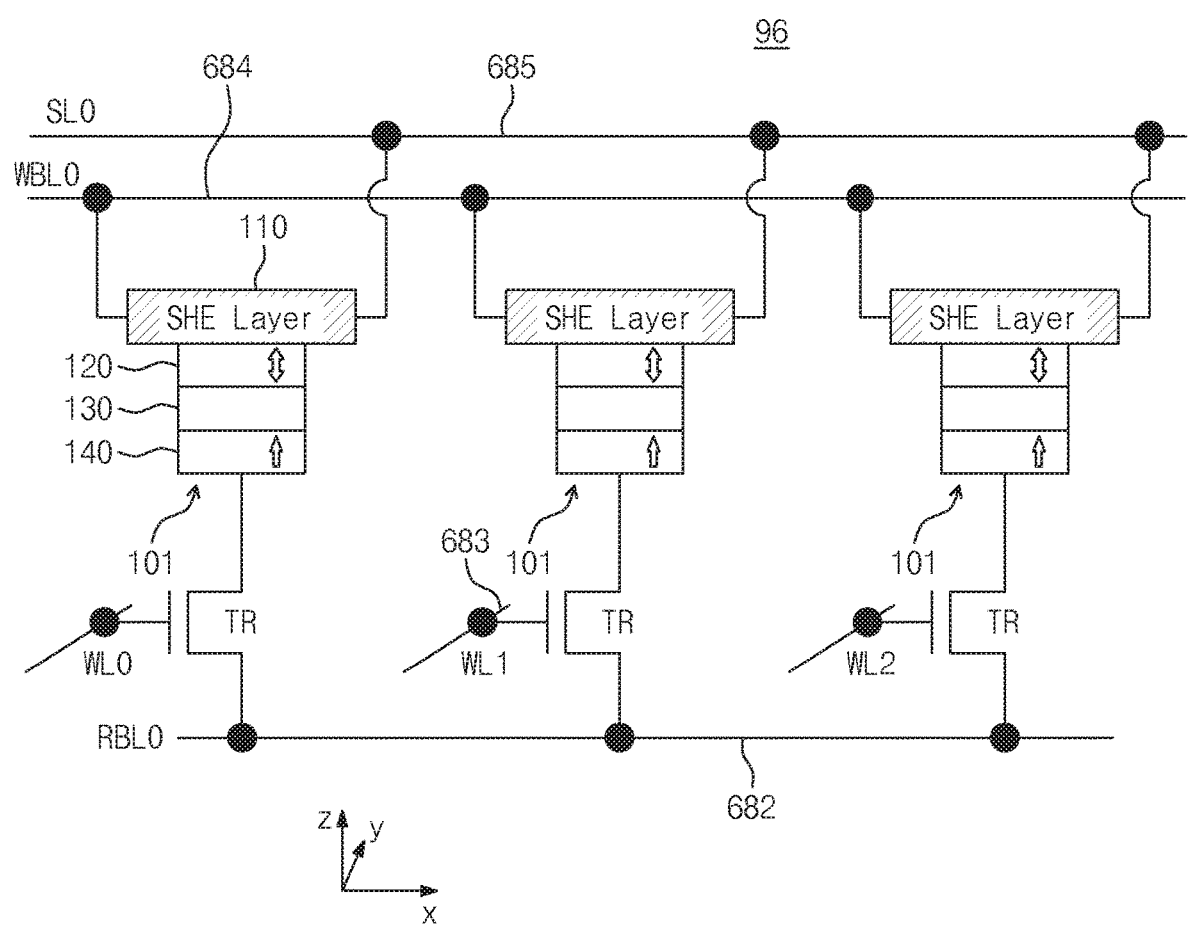

FIG. 20 illustrates a magnetic memory device according to another example embodiment of the present disclosure.

Referring to FIG. 20, a magnetic memory device 96 includes a plurality of magnetic tunnel junctions. The magnetic memory device 96 includes a plurality of magnetic tunnel junctions 101 arranged in a matrix format and a first conductive pattern 110 disposed adjacent to a free magnetic body 120 of the magnetic tunnel junction 101. A fixed magnetic body 140 has a fixed magnetization direction and is a thin film formed of a material magnetized in a direction perpendicular to a film surface. The free magnetic body 120 changes in a magnetization direction and is a thin film formed of a material magnetized in a direction perpendicular to a film surface. The free magnetic body 120 has a structure of [auxiliary free magnetic layer/free non-magnetic layer]$_N$/main free magnetic layer, where N is a positive integer greater than or equal to 2 and indicates that an [auxiliary free magnetic layer/free non-magnetic layer] structure is stacked repeatedly N times. Among the free magnetic layers 122a to 122n and 126 constituting the free magnetic body 120, two magnetic layers closest to each other are magnetized in opposite directions by RKKY exchange interaction through free magnetic layers 124a to 124n. The magnetic tunnel junction 101 may include a fixed magnetic body 140, an insulator 130, and a free magnetic body 120 that are sequentially stacked.

The first conductive pattern 110 or WBL may extend on a substrate plane in a first direction, and a free magnetic body 120 of each of the magnetic tunnel junctions arranged in the first direction may be periodically disposed adjacent to the first conductive pattern 110. The first conductive pattern 110 may provide spin current to the free magnetic layer and may apply a spin-orbit spin torque to the free magnetic body 120. The spin-orbit spin torque may contribute to magnetization reversal of the free magnetic body 120.

Selection transistors TR may be connected to fixed magnetic body 140 of the magnetic tunnel junctions 101, respectively.

A second conductive pattern 682 or RBL may be connected to a source/drain of each of the selection transistors TR arranged in the first direction and may extend in the first direction.

A third conductive pattern 683 or WL may be connected to a gate of each of selection transistors TR arranged in a second direction perpendicular to the first direction and may extend in the second direction.

A fourth conductive pattern 684 or WBL may be connected to one end of each of the first conductive pattern 110 arranged in the first direction and may extend in the first direction.

A fourth conductive pattern 685 or SL may be connected to the other end of the first conductive pattern 110 arranged in the first direction and may extend in the first direction.

Figure 21:
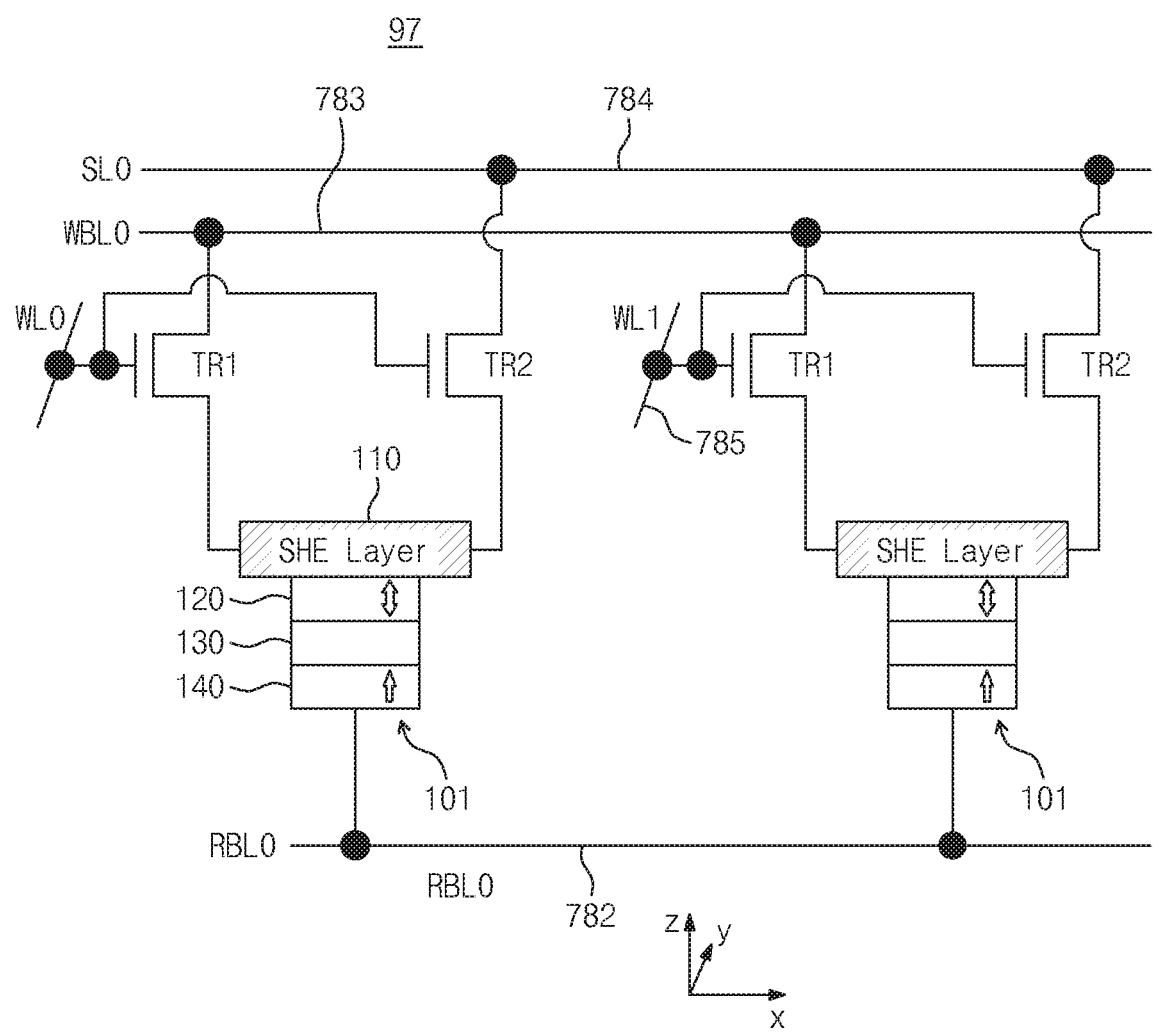

FIG. 21 illustrates a magnetic memory device according to another example embodiment of the present disclosure.

Referring to FIG. 21, a magnetic memory device 97 includes a plurality of magnetic tunnel junctions. The magnetic memory device 97 includes a plurality of magnetic tunnel junctions 101 arranged in a matrix format and a first conductive pattern 110 disposed adjacent to a free magnetic body 120 of the magnetic tunnel junction 101. A fixed magnetic body 140 has a fixed magnetization direction and is a thin film formed of a material magnetized in a direction perpendicular to a film surface. The free magnetic body 120 changes in a magnetization direction and is a thin film formed of a material magnetized in a direction perpendicular to a film surface. The free magnetic body 120 has a structure of [auxiliary free magnetic layer/free non-magnetic layer]$_N$/main free magnetic layer, where N is a positive integer greater than or equal to 2 and indicates that an [auxiliary free magnetic layer/free non-magnetic layer] structure is stacked repeatedly N times. Among the free magnetic layers 122a to 122n and 126 constituting the free magnetic body 120, two magnetic layers closest to each other are magnetized in opposite directions by RKKY exchange interaction through free magnetic layers 124a to 124n. The magnetic tunnel junction 101 may include a fixed magnetic body 140, an insulator 130, and a free magnetic body 120 that are sequentially stacked.

The first conductive pattern 110 or WBL may extend on a substrate plane in a first direction, and a free magnetic body 120 of each of the magnetic tunnel junctions arranged in the first direction may be periodically disposed adjacent to the first conductive pattern 110. The first conductive pattern 110 may provide spin current to the free magnetic layer and may apply a spin-orbit spin torque to the free magnetic body 120. The spin-orbit spin torque may contribute to magnetization reversal of the free magnetic body 120.

A second conductive pattern 782 may be electrically connected to each of fixed magnetic bodies 140 of the magnetic tunnel junctions 101 arranged in the first direction and may extend in the second direction.

A first selection transistor TR1 may be connected to one end of each of the first conductive patterns 110.

A second selection transistor TR2 may be connected to the other end of each of the first conductive patterns 110.

A third conductive pattern 783 or WBL may be connected to a source/drain of the first selection transistor TR1 disposed in the first direction and may extend in the first direction.

A fourth conductive pattern 784 or SL may be connected to a source/drain of the second transistor TR2 disposed in the first direction and may extend in the first direction.

A fifth conductive pattern 785 may extend in the second direction by connecting a gate of the first selection transistor TR1 disposed in a second direction perpendicular to the first direction and a gate of the second selection transistor TR2 to each other.

Figure 22:
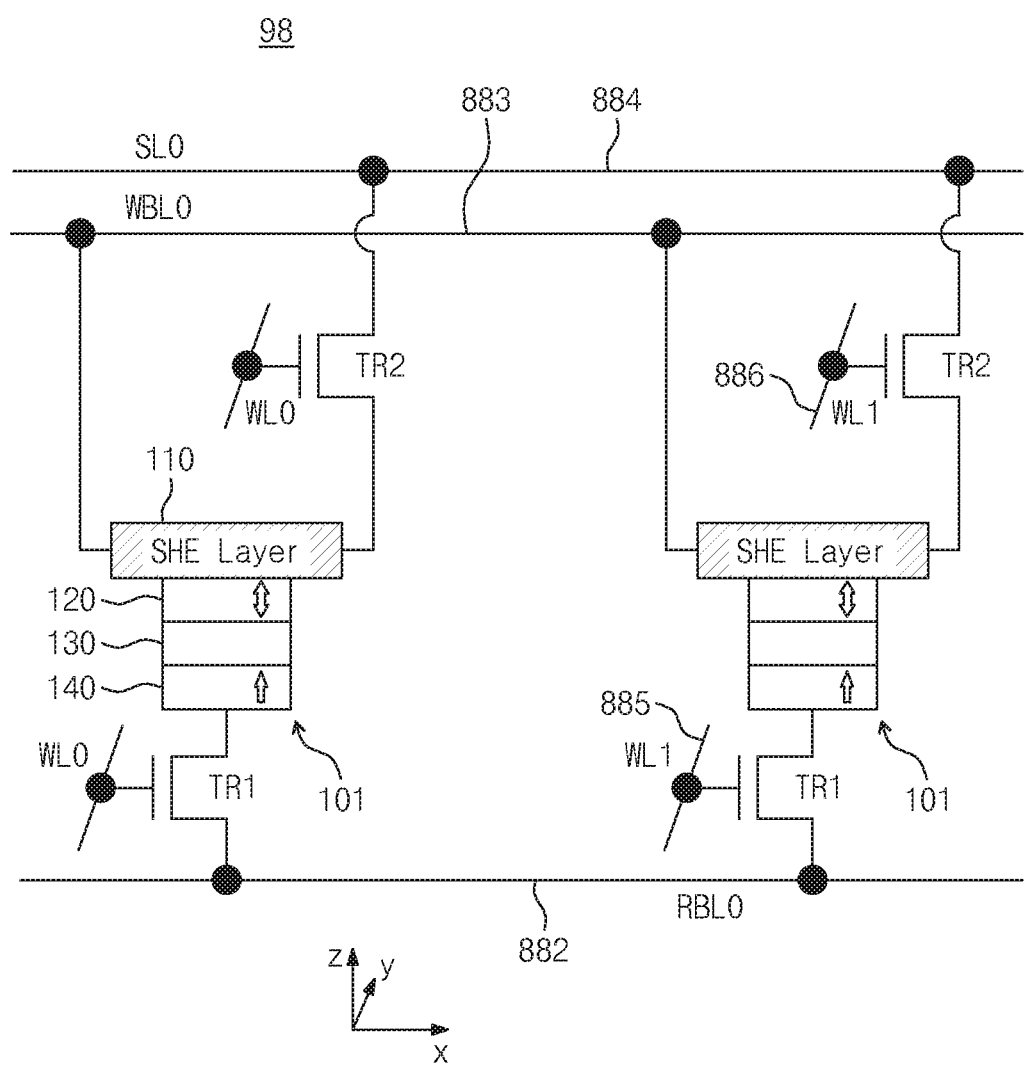

FIG. 22 illustrates a magnetic memory device according to another example embodiment of the present disclosure.

Referring to FIG. 21, a magnetic memory device 98 includes a plurality of magnetic tunnel junctions. The magnetic memory device 98 includes a plurality of magnetic tunnel junctions 101 arranged in a matrix format and a first conductive pattern 110 disposed adjacent to a free magnetic body 120 of the magnetic tunnel junction 101. A fixed magnetic body 140 has a fixed magnetization direction and is a thin film formed of a material magnetized in a direction perpendicular to a film surface. The free magnetic body 120 changes in a magnetization direction and is a thin film formed of a material magnetized in a direction perpendicular to a film surface. The free magnetic body 120 has a structure of [auxiliary free magnetic layer/free non-magnetic layer]$_N$/main free magnetic layer, where N is a positive integer greater than or equal to 2 and indicates that an [auxiliary free magnetic layer/free non-magnetic layer] structure is stacked repeatedly N times. Among the free magnetic layers 122a to 122n and 126 constituting the free magnetic body 120, two magnetic layers closest to each other are magnetized in opposite directions by RKKY exchange interaction through free magnetic layers 124a to 124n. The magnetic tunnel junction 101 may include a fixed magnetic body 140, an insulator 130, and a free magnetic body 120 that are sequentially stacked.

The first conductive pattern 110 or WBL may extend on a substrate plane in a first direction, and a free magnetic body 120 of each of the magnetic tunnel junctions arranged in the first direction may be periodically disposed adjacent to the first conductive pattern 110. The first conductive pattern 110 may provide spin current to the free magnetic layer and may apply a spin-orbit spin torque to the free magnetic body 120. The spin-orbit spin torque may contribute to magnetization reversal of the free magnetic body 120.

A first selection transistor TR1 may be connected to each of fixed magnetic bodies 140 of the magnetic tunnel junctions 101.

A second selection transistor TR2 may be connected to one end of each of the first conductive patterns 110.

A second conductive pattern 882 or RBL may be connected to a source/drain of the first selection transistor TR1 disposed in the first direction and may extend in the first direction.

A third conductive pattern 883 or WBL may connect the other ends of the first conductive patterns 110 arranged in the first direction to each other and extend in the first direction.

A fourth conductive pattern 884 or SL may connect sources/drains of the second selection transistors TR2 arranged in the first direction to each other and may extend in the first direction.

A fifth conductive pattern 885 or WL may connect gates of first selection transistors arranged in a second direction perpendicular to the first direction to each other and may extend in the second direction.

A sixth conductive pattern 886 or WL may connect gates of the second selection transistors arranged in the second direction to each other and may extend in the second direction.

Referring to FIGS. 15 through 21 and FIG. 8, the free magnetic body 120 may include at least one magnetic domain structure. The magnetic domain structure may be a magnetic domain wall or a skyrmion.

Referring to FIGS. 15 through 21 and FIG. 9, the first conductive pattern 110 may apply in-plane current and include an antiferromagnetic layer. The first conductive pattern 110 may provide an in-plane exchange bias magnetic field to the main free magnetic layer.

Referring to FIGS. 15 through 21 and FIG. 10, the first conductive pattern 110 may apply in-plane current and include an antiferromagnetic layer and a ferromagnetic layer that are sequentially stacked. The antiferromagnetic layer is disposed adjacent to the main free magnetic layer, the ferromagnetic layer has an in-plane magnetization direction, the first conductive pattern provides an in-plane exchange bias magnetic field to the main free magnetic layer, and the free magnetic body may be switched without an external magnetic field.

Referring to FIGS. 15 through 21 and FIG. 11, a dipole field non-magnetic layer and a dipole field ferromagnetic layer having an in-plane magnetization direction, which are sequentially stacked adjacent to the fixed magnetic body, may be further provided. The non-magnetic layer may be disposed adjacent to the fixed magnetic body. The free magnetic body may be switched without an external magnetic field by an in-plane magnetic field provided from the dipole field ferromagnetic layer.

Referring to FIGS. 15 through 21 and FIG. 12, an auxiliary insulating layer may be further provided between the first conductive pattern 110 and the free magnetic body 120.

Referring to FIGS. 15 through 21 and FIG. 13, the first conductive pattern 110 may include a first conductive pattern non-magnetic layer and a first conductive pattern magnetic layer that are sequentially stacked, and the first conductive pattern magnetic layer may include an in-plane magnetization direction component.

Referring to FIGS. 15 through 21 and FIG. 14, the first conductive pattern 110 may include a first conductive pattern magnetic layer and a first conductive pattern non-magnetic layer that are sequentially stacked and may include a non-magnetic layer disposed between the first conductive pattern magnetic layer and the free magnetic body.

As described above, a magnetic tunnel junction device according to an example embodiment of the present disclosure may provide a characteristic in which efficiency of a spin-orbit spin torque is not in proportion to a thickness of a free magnetic body and is relatively irrelevant thereto, by using a characteristic in which when current flows along a conducting wire adjacent to the free magnetic body in an in-plane direction, spin current generated by spin Hall effect or Rashba effect is not entirely absorbed to a surface of the free magnetic body and is relatively uniformly absorbed throughout the thickness of the free magnetic body. Accordingly, if the total thickness d of the free magnetic body increases by increasing N of a structure of [magnetic layer/non-magnetic layer]$_N$/magnetic layer, thermal stability is improved while critical current $I_c$ is irrelevant to the total thickness d of the free magnetic body. Thus, non-volatility may be secured (e.g., $\Delta$>50) and a device may be driven through low critical current even when a magnetic tunnel junction having a very small cross-sectional area is used. As a result, a magnetic tunnel junction structure may be implemented to enable an ultrahigh nonvolatile device to be driven at low power.

Although the present disclosure and its advantages have been described in detail, it should be understood that various changes, substitutions and alterations can be made herein without departing from the spirit and scope of the disclosure as defined by the following claims.

What is claimed is:

1. A magnetic memory device comprising:
a plurality of magnetic tunnel junctions arranged in a matrix format; and
a first conductive pattern disposed adjacent to a free magnetic body of the magnetic tunnel junction,
wherein each of the magnetic tunnel junctions includes a fixed magnetic body, an insulator, and a free magnetic body that are sequentially stacked,
the fixed magnetic body that has a fixed magnetization direction and is a thin film including a material magnetized in a direction perpendicular to a film surface,
the free magnetic body is configured to change in magnetization direction and is a thin film including a material magnetized in a direction perpendicular to a film surface,
wherein the free magnetic body is disposed adjacent to the first conductive pattern generating spin current by in-plane current,
wherein a spin-orbit spin torque is generated by spin Hall effect or Rashba effect by applying in-plane current to the first conductive pattern,
wherein the first conductive pattern applying the in-plane current includes an antiferromagnetic layer and a ferromagnetic layer that are sequentially stacked,
the antiferromagnetic layer is disposed adjacent to the free magnetic body,
the ferromagnetic layer has an in-plane magnetization direction,
the first conductive pattern provides an in-plane exchange bias magnetic field to the free magnetic body, and
the free magnetic body is switched without an external magnetic field.

2. The magnetic memory device as set forth in claim 1, wherein the first conductive pattern runs parallel on a substrate plane in a first direction, and
a free magnetic body of each of magnetic tunnel junctions arranged in the first direction is periodically disposed adjacent to the first conductive pattern,
the magnetic memory device further comprising:
a second conductive pattern that is electrically connected to a fixed magnetic body of each of magnetic tunnel junctions arranged in a second direction perpendicular to the first direction and extends on the substrate plane in the second direction.

3. The magnetic memory device as set forth in claim 1, wherein the first conductive pattern is periodically disposed on a substrate plane in a first direction, and a free magnetic body of each of magnetic tunnel junctions arranged in the first direction is periodically disposed adjacent to the first conductive pattern, the magnetic memory device further comprising:

a second conductive pattern that is electrically connected to a fixed magnetic body of each of the magnetic tunnel junctions arranged in the first direction and extends on the substrate plane in the first direction;

a third conductive pattern that is connected to one end of each of the first conductive patterns arranged in the first direction and extends in the first direction; and a fourth conductive pattern that is connected to the other end of each of the first conducive patterns arranged in the second direction and extends in the second direction.

4. The magnetic memory device as set forth in claim 1, wherein the first conductive pattern extends on a substrate plane in a first direction, and a free magnetic body of each of magnetic tunnel junctions arranged in the first direction is periodically disposed adjacent to the first conductive pattern, the magnetic memory device further comprising:

selection transistors that are electrically connected to fixed magnetic bodies of the magnetic tunnel junctions, respectively;

a second conductive patterns that is electrically connected to a source/drain of each of selection transistors arranged in the first direction and extends on the substrate plane in the first direction; and a third conductive pattern that is connected to a gate of each of selection transistors arranged in a second direction perpendicular to the first direction.

5. The magnetic memory device as set forth in claim 1, wherein the first conductive pattern extends on a substrate plane in a first direction, and a free magnetic body of each of magnetic tunnel junctions arranged in the first direction is periodically disposed adjacent to the first conductive pattern, the magnetic memory device further comprising:

selection transistors that are electrically connected to fixed magnetic bodies of the magnetic tunnel junctions, respectively;

a second conductive patterns that is electrically connected to a source/drain of each of selection transistors arranged in the first direction and extends on the substrate plane in the first direction; and a third conductive pattern that is connected to a gate of each of the selection transistors arranged in the first direction.

6. The magnetic memory device as set forth in claim 1, wherein the first conductive pattern extends on a substrate plane in a first direction, and a free magnetic body of each of magnetic tunnel junctions arranged in the first direction is periodically disposed adjacent to the first conductive pattern, the magnetic memory device further comprising:

a second conductive pattern that is electrically connected to a fixed magnetic body of each of magnetic tunnel junctions arranged in the first direction;

a third conductive pattern that is connected to one end of the conductive pattern disposed in the first direction;

selection transistors connected to the other end of the first conductive pattern;

a fourth conductive pattern that is connected to a source/drain of each of selection transistors arranged in the first direction and extends in the first direction; and a fourth conductive pattern that is connected to a gate of each of selection transistors arranged in a second direction perpendicular to the first direction and extends in the second direction.

7. The magnetic memory device as set forth in claim 1, wherein the first conductive pattern extends on a substrate plane in a first direction, and a free magnetic body of each of magnetic tunnel junctions arranged in the first direction is periodically disposed adjacent to the first conductive pattern, the magnetic memory device further comprising:

selection transistors that are connected to fixed magnetic bodies of the magnetic tunnel junctions, respectively;

a second conductive pattern that is connected to a source or drain of each of selection transistors arranged in the first direction;

a third conductive pattern that is connected to a gate of each of selection transistors arranged in a second direction perpendicular to the first direction and extends in the second direction;

a fourth conductive pattern that is connected to one end of the first conductive pattern disposed in the first direction; and a fifth conductive pattern that is connected to the other end of the first conductive pattern disposed in the first direction and extends in the first direction.

8. The magnetic memory device as set forth in claim 1, wherein the first conductive pattern extends on a substrate plane in a first direction, and a free magnetic body of each of magnetic tunnel junctions arranged in the first direction is periodically disposed adjacent to the first conductive pattern, the magnetic memory device further comprising:

a second conductive pattern that is electrically connected to a fixed magnetic body of each of magnetic tunnel junctions arranged in the first direction;

a first selection transistor that is connected to one end of the first conductive pattern;

a second selection transistor connected to the other end of the first conductive pattern;

a third conductive pattern that is connected to a source/drain of the first selection transistor disposed in the first direction and extends in the first direction;

a fourth conductive pattern that is connected to a source/drain of the second selection transistor disposed in the first direction and extends in the first direction; and a fifth conductive pattern that extends in a second direction by connecting a gate of the first selection transistor disposed in the second direction perpendicular to the first direction and a gate of the second selection transistor to each other.

9. The magnetic memory device as set forth in claim 1, wherein the first conductive pattern extends on a substrate plane in a first direction, and a free magnetic body of each of magnetic tunnel junctions arranged in the first direction is periodically disposed adjacent to the first conductive pattern, the magnetic memory device further comprising:

a first selection transistor that is connected to a fixed magnetic body of each of the magnetic tunnel junctions;

a second selection transistor that is connected to one end of the first conductive pattern;

a second conductive pattern that is connected to a source/drain of the first selection transistor disposed in the first direction and extends in the first direction;

a third conductive pattern that connects the other ends of first conductive patterns arranged in the first direction to each other and extends in the first direction;

a fourth conductive pattern that connects sources/drains of second transistors arranged in the first direction to each other and extend in the first direction;

a fifth conductive pattern that connects gates of first selection transistors arranged in a second direction perpendicular to the first direction to each other and extends in the second direction; and a sixth conductive pattern that connects gates of second selection transistors arranged in the second direction to each other and extends in the second direction.

\* \* \* \* \*